(12) United States Patent
Okumura et al.

(10) Patent No.: US 7,745,857 B2
(45) Date of Patent: Jun. 29, 2010

(54) SEMICONDUCTOR DEVICE AND ITS MANUFACTURING METHOD

(75) Inventors: Yohichi Okumura, Tokyo (JP); Hiroyuki Tomomatsu, Oita (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/393,935

(22) Filed: Mar. 29, 2006

(65) Prior Publication Data
US 2006/0220076 A1    Oct. 5, 2006

(30) Foreign Application Priority Data
Mar. 29, 2005    (JP)    ............... 2005-094009

(51) Int. Cl.
*H01L 29/06* (2006.01)
(52) U.S. Cl. .................. 257/292; 257/233; 257/231; 257/448; 257/435; 257/293; 257/294; 257/461; 257/440; 257/E27.133; 257/E27.134; 257/E27.135
(58) Field of Classification Search .......... 257/233, 257/292, 231, 448, 435, 294, 293, 461, 440, 257/E27.133–135
See application file for complete search history.

(56) References Cited

U.S. PATENT DOCUMENTS 5,844,290 A * 12/1998 Furumiya ............... 257/233

2005/0051860 A1 * 3/2005 Takeuchi et al. ........... 257/436
2005/0101073 A1 * 5/2005 Bae et al. .................. 438/164

\* cited by examiner

*Primary Examiner*—Cuong Q Nguyen
*Assistant Examiner*—Trang Q Tran
(74) *Attorney, Agent, or Firm*—Warren L. Franz; Wade J. Brady, III; Frederick J. Telecky, Jr.

(57) ABSTRACT

The object of the invention is to provide a semiconductor device that can form photodiodes that do not short circuit, without damage that causes leakage, despite formation of the opening part, and its manufacturing method. The second semiconductor layer (12, 16) of the second conductivity type is formed on the main surface of the first semiconductor layer (10, 11) of the first conductivity type. Element-separating regions (13, 14, 15, 17) formed at least on the second semiconductor layer separate the device into the regions of plural photodiodes (PD1-PD4). Conductive layer 18 is formed on the second semiconductor layer 16 in a pattern that is divided for each of the photodiodes and is connected to the second semiconductor layer 16 along the outer periphery with respect to all of the plural photodiodes. Insulation layer (19, 21) is formed on the entire surface to cover conductive layer 18. An opening part, which reaches the second semiconductor layer 16, is formed in the insulation layer (19, 21) in the region inside the pattern of conductive layer 18.

3 Claims, 33 Drawing Sheets

SEMICONDUCTOR DEVICE AND ITS MANUFACTURING METHOD

FIELD OF THE INVENTION

The present invention pertains to a semiconductor device having photodiodes and its manufacturing method. In particular, the present invention pertains to a semiconductor device having plural integrated adjacent photodiodes and its manufacturing method.

BACKGROUND OF THE INVENTION

Photodiodes generate current after receiving light. They are widely used as light-receiving elements for optical pickup devices incorporated into optical disc devices, such as CD or DVD devices. A photodiode is constituted by a semiconductor with pn junctions. A reverse bias is applied to the pn junction to widen the depletion layer, and a high electric field is applied. Electron-hole pairs are generated by the absorbed light in the depletion layer. Under the attraction of the electric field, the electrons move to the n-type semiconductor region, while the holes move to the p$^-$-type semiconductor region to form a current.

Types of photodiodes include PIN photodiodes, which have a p$^-$-layer or n$^-$-layer or other intrinsic layer (referred to as Layer I hereinafter) containing electroconductive impurity at low concentration between the p layer and n layer and can easily widen the depletion layer at a low voltage, and avalanche photodiode having a region where avalanche decay occurs.

Japanese Kokai Patent Application No. 2001-320079 discloses a photodiode manufacturing method that can be used to remove the insulation film on the top layer of the diode without having film peel-off or leakage.

The photodiode formed by the aforementioned method is shown in FIG. 26(A), which is a plan view, and FIG. 26(B), which is the cross-sectional view shown in FIG. 26(A).

For example, p$^-$-type epitaxial layer 101 is formed as Layer I on p$^{++}$-type silicon semiconductor substrate 100, and n-type epitaxial layer 102 is formed on it to form a pn junction. Also, n$^+$-type semiconductor region 103 is formed in the surface layer part of n-type epitaxial layer 102 in the PIN photodiode region. Silicon nitride layer 103$a$ is formed on the surface in the central part of n$^+$-type semiconductor region 103. Silicide layer 103$b$ made of platinum silicide, etc., is formed near the edge of n$^+$-type semiconductor region 103 in the outer periphery of silicon nitride layer 103$a$. Silicon nitride layer 103$a$ and silicide layer 103$b$ have a film thickness of, for example, 30 nm. Also, LOCOS element-separating insulation film 104 is formed to surround PIN photodiode region.

A ring-shaped mask layer 105 made of a metal layer is formed from n$^+$-type semiconductor region 103 in the outer periphery of the PIN photodiode to element-separating insulation film 104, and an interlayer insulation film 106 is formed on the mask layer. An opening part H is formed on interlayer insulation film 106 along the inner periphery of metal layer 105 to expose the surface of silicon nitride layer 103$a$ and silicide layer 103$b$ on n$^+$-type semiconductor region 103 in the photodiode region. A surface protective layer 108 is formed to cover opening part H.

In this way, a PIN photodiode PD with the aforementioned configuration is formed.

In the PIN photodiode with the aforementioned configuration, when a reverse bias is applied to n$^+$-type semiconductor region 103 and p$^-$ type epitaxial layer 101, the depletion layer is widened from the pn junction surface. When light is incident on the formed depletion layer, electron hole pairs are generated, and optical signals are obtained.

In this case, mask layer 105 is connected to n$^+$ semiconductor region 103, and voltage can be applied to n$^+$-type semiconductor region 103 via mask layer 105.

In the following, the method of forming the aforementioned PIN photodiode PD will be explained.

As shown in the FIG. 27(A) and FIG. 27(B), p-type epitaxial layer 101 and n-type epitaxial layer 102 as Layer I are formed on p$^{++}$-type silicon semiconductor substrate 100, and element separation is performed using LOCOS element-separating insulation film 104, etc., n$^+$-type semiconductor region 103 is formed by means of ion injection in the surface layer part of n-type epitaxial layer 102 in the PIN photodiode region separated by LOCOS element-separating insulation film 104. Also, silicon nitride layer 103$a$ with a thickness of about 30 nm is formed on the surface in the central part of n$^+$-type semiconductor region 103. With silicon nitride layer 103$a$ having silicide masking function used as a mask, silicide layer 103$b$ made of platinum silicide, etc., and having a thickness of about 30 nm is formed on the surface near the edge of n$^+$-type semiconductor region 103 in the outer periphery of silicon nitride layer 103$a$.

Then, a metal layer made of TiW, etc., is deposited in a thickness of 200-300 nm by means of sputtering, followed by patterning to form mask layer 105 that covers n$^+$-type semiconductor region 103 and is extended all the way to LOCOS element-separating insulation film 104.

Then, insulation film 106 is formed on the entire surface of mask layer 105. In this case, insulation film 106 is formed by laminating plural layers by depositing silicon oxide by CVD with TEOS used as the raw material, or by depositing a BPSG film, or by depositing silicon nitride via CVD.

Then, as shown FIG. 28(A) and FIG. 28(B), a resist film 107 with a pattern that opens the photosensitive region of the photodiode is formed on insulation film 106. After that, dry etching, such as RIE (reactive ion etching), is performed with mask layer 105 serving as the etching stopper to eliminate the insulation film 106 on the aforementioned photosensitive region to form opening part H.

Then, as shown in FIG. 29(A) and FIG. 29(B), mask layer 105 in the area exposed in opening part H is removed selectively with respect to n$^+$-type semiconductor region 103 and insulation film 106 by means of wet etching to expose n$^+$-type semiconductor region 103.

Then, surface protective layer 108 is formed on the entire surface to obtain the semiconductor device having the PIN photodiode shown in FIG. 26(A) and FIG. 26(B).

In the method of manufacturing a semiconductor device having the aforementioned PIN photodiode, when removing the insulation film 106 from the diode, since mask layer 105 serves as an etching stopper, even if dry etching is used so that no hollow parts are formed on the inner wall surface of opening part H to cause film peeling, no damage that could allow leakage will be caused because the silicon substrate is protected by mask layer 105 in that step.

Also, when eliminating mask layer 105 exposed in the aforementioned opening part H, even if wet etching is used to avoid damage to the silicon substrate, mask layer 105 can be removed selectively without forming hollow parts on the inner wall surface of opening part H of insulation film 106.

However, when the aforementioned photodiode is used as a light-receiving element for an optical pickup device incorporated into a CD, DVD, or other optical disc device, in order to obtain the tracking error signal or focus error signal from the signal fed back from the optical disc, it is necessary to use PDIC formed by combining plural photodiodes.

FIG. 30 is the plan view of a PDIC formed by combining, for example, 4 PIN photodiodes. This figure shows how laser spot S, which is the signal fed back from the optical disc, is incident to the four PIN photodiodes PD1-4.

In this case, laser spot S is incident to target the center of the four PIN photodiodes PD1-4. However, since the part in the intervals between the four PIN photodiodes PD1-4 becomes a dead area, it is desirable to reduce the intervals between the four PIN photodiodes PD1-4 to, for example, 5 μm or less in order to increase the sensitivity.

FIG. 31 is a plan view illustrating the light-receiving surfaces of the photodiodes when the method described in the above-referenced Japanese patent application is applied to the four PIN photodiodes PD1-4 with the intervals reduced to about 5 μm as described above.

The four PIN photodiodes PD1-4 are covered by a common mask layer 110. After the opening part is formed in the insulation film, the mask layer in the opening part is removed. In this case, however, mask layer 110, which is a common conductive layer, is connected to the $n^+$-type semiconductor region equivalent to the light-receiving surface of each of the four PIN photodiodes PD1-4. As a result, a short circuit between the diodes becomes a problem.

FIG. 32 is a plan view illustrating the light-receiving surface of a photodiode in the case when the mask layers are formed independently, and the four PIN photodiodes PD1-4 with an opening part formed in each of them can be laid out as close to each other as possible.

Independent mask layers (111-114) are formed with respect to the four PIN photodiodes PD1-4, respectively.

In this layout, however, the intervals between the four PIN photodiodes PD1-4 are increased to 20 μm, making it difficult to use them as the light-receiving element of an optical pickup device.

SUMMARY OF THE INVENTION

The objective of the present invention is to solve the aforementioned problems by providing a semiconductor device and its manufacturing method. For this semiconductor device, even if the opening part is formed in the insulation film in order to improve the sensitivity, since the conductive layer and the mask layer are used as an etching stopper, leakage-causing damage can be prevented. Since the conductive layer connected to the second semiconductor layer that constitutes each photodiode is formed in a pattern divided for each photodiode, the photodiodes can be constituted so as to not short circuit.

In order to realize the aforementioned objective, the present invention provides a semiconductor device having plural photodiodes formed side-by-side via element-separating regions, characterized by the following facts: the semiconductor device has a first semiconductor layer of a first conductivity type, a second semiconductor layer of a second conductivity type formed on the main surface of the first semiconductor layer, element-separating regions formed at least in the second semiconductor layer to separate the plural photodiodes from each other, a conductive layer that is connected to the second semiconductor layer in the outer periphery with respect to all of the plural photodiodes and is formed on the second semiconductor layer in a pattern divided for each of the photodiodes, and an insulating layer formed on the entire surface to cover the conductive layer; an opening part is formed in the insulating layer all the way to the second semiconductor layer in the region inside the pattern of the conductive layer.

For the aforementioned semiconductor device of the present invention, the second semiconductor layer of the second conductivity type is formed on the main surface of the first semiconductor layer of the first conductivity type. The element-separating regions formed at least in the second semiconductor layer separate the regions of the plural photodiodes.

Also, the conductive layer is connected to the second semiconductor layer along the outer periphery with respect to all of the plural photodiodes and is formed on the second semiconductor layer in a pattern divided for each of the photodiodes.

Then, an insulation layer is formed on the entire surface to cover the conductive layer, and an opening part that extends to the second semiconductor layer is formed in the insulation layer in the region inside the pattern of the conductive layer.

For the aforementioned semiconductor device of the present invention, preferably, the insulating layer includes a first insulating layer and a second insulating layer formed on the first insulating layer, and there is also a mask layer formed between the first and second insulating layers or on the first insulating layer.

More preferably, the mask layer is formed in a pattern having regions superposed with the conductive layer formed on the second semiconductor layer of the adjacent photodiodes.

Most preferably, the mask layer is formed in a pattern having the superposed regions outside the conductive layer. Or, the conductive layer is also formed on the element-separating regions between the photodiodes, and the mask layer is formed in a pattern having the superposed regions on the conductive layer on the element-separating regions between the photodiodes in the opening part inside the conductive layer.

Also, preferably, the mask layer is formed in a ring shape along the outer periphery of the opening part.

In addition, in order to realize the aforementioned objective, the present invention provides a semiconductor device manufacturing method used for manufacturing a semiconductor device having plural photodiodes formed side-by-side via element-separating regions, characterized by having the following steps: a second semiconductor layer of a second conductivity type is formed on the main surface of a first semiconductor layer of a first conductivity type; element-separating regions are formed at least in the second semiconductor layer to separate the plural photodiodes; a conductive layer is formed on the second semiconductor layer; a first insulating layer is formed on the conductive layer; a mask layer having regions superposed with the conductive layer is formed on the first insulating layer; a second insulating layer is formed on the mask layer; a first etching step is performed, in which an opening part exposing the conductive layer and mask layer is formed in the first and second insulating layers with the conductive layer and mask layer used as etching stopper in a pattern such that the conductive layer and/or mask layer is present at any position in the opening region; and a second etching step is performed, in which the conductive layer exposed in the opening part is removed.

According to the semiconductor device manufacturing method of the present invention, first, the second semiconductor layer of the second conductivity type is formed on the main surface of the first semiconductor layer of the first conductivity type, and the element-separating regions are formed at least in the second semiconductor layer to separate the plural photodiodes.

Then, the conductive layer is formed on the second semiconductor layer, followed by forming the first insulation layer on the conductive layer. The mask layer having regions superposed with the conductive layer is formed on the first insulation layer, and the second insulation layer is formed on the mask layer.

Then, in the first etching step, an opening part exposing the conductive layer and mask layer is formed in the first and second insulating layers with the conductive layer and mask layer used as etching stopper in such a pattern that the conductive layer and/or mask layer are present at any position in the opening region. In the second etching step, the conductive layer exposed in the opening part is removed.

For the semiconductor device manufacturing method of the present invention, preferably, in the step of forming the conductive layer, the layer is formed in a pattern covering all of the photodiodes. In the step of forming the mask layer, the layer is formed in a pattern having regions superposed with the conductive layer in the outside region of the conductive layer in the extended parts of the element-separating regions between the adjacent photodiodes. In the aforementioned second etching step, the conductive layer in the superposed regions is removed by means of over-etching.

Or, preferably, in the step of forming the conductive layer, the layer is formed to extend to cover the element-separating regions between the adjacent photodiodes. In the step of forming the mask layer, the layer is formed in a pattern having regions superposed with the conductive layer on the element-separating regions between the photodiodes.

Also, preferably, the first etching is dry etching, while the second etching is wet etching.

Moreover, in order to realize the aforementioned purpose, the present invention provides a semiconductor manufacturing method used for manufacturing a semiconductor device having plural photodiodes formed side-by-side via element-separating regions, characterized by having the following steps: a second semiconductor layer of a second conductivity type is formed on the main surface of a first semiconductor layer of a first conductivity type; element-separating regions are formed at least in the second semiconductor layer to separate the plural photodiodes; a conductive layer is formed on the aforementioned second semiconductor layer to be connected to the second semiconductor layer in the outer periphery with respect to all of the plural photodiodes and in a pattern divided for each of the photodiodes; a first mask layer is formed in the region inside the conductive layer on the aforementioned second semiconductor layer; a first insulating layer is formed on the aforementioned conductive layer and the first mask layer; a first etching step is performed, in which an opening part is formed in the aforementioned first insulating layer with the first mask layer used as etching stopper; and a second etching step is performed, in which the first mask layer exposed in the aforementioned opening part is completely removed by means of over-etching, including the part remaining on the outer periphery of the opening part.

According to the aforementioned semiconductor device manufacturing method of the present invention, the second semiconductor layer of the second conductivity type is formed on the main surface of the first semiconductor layer of the first conductivity type, and the element-separating regions are formed at least in the second semiconductor layer to separate the plural photodiodes.

Then, a conductive layer is formed in a pattern, which is connected to the second semiconductor layer along the outer periphery with respect to all of the photodiodes on the second semiconductor layer and is divided for each photodiode. A first mask layer is formed in the region inside the conductive layer on the second semiconductor layer.

Then, the first insulation layer is formed on the conductive layer and the first mask layer. In the first etching step, an opening part is formed in the first insulation layer with the first mask layer serving as etching stopper. In the second etching step, the first mask layer exposed in the opening part is completely removed by means of over-etching, including the part remaining on the outer periphery of the opening part.

Preferably, the aforementioned semiconductor device manufacturing method also has a step in which a ring-shaped second mask layer having a superposed region in the outer periphery of the aforementioned first mask layer is formed on the aforementioned first insulating layer after the first insulating layer is formed but before the first etching step, and a step in which a second insulating layer is formed on the second mask layer. In the first etching step, an opening part exposing the aforementioned conductive layer and mask layer is formed in the aforementioned first and second insulating layers with the aforementioned conductive layer and mask layer used as etching stopper in such a pattern that the aforementioned conductive layer and/or mask layer are present at any position in the opening region.

Also, preferably, the aforementioned first etching is dry etching, while the aforementioned second etching is wet etching.

REFERENCE NUMERALS AND SYMBOLS AS SHOWN IN THE DRAWINGS

In the figures, 10 represents a $p^{++}$-type silicon semiconductor substrate, 11 a $p^-$ type epitaxial layer, 12 an n-type epitaxial layer, 13, 14, 15 a $p^{++}$-type semiconductor region, 16 an $n^+$-type semiconductor region, 16a a silicon nitride layer, 16b a silicide layer, 17 a LOCOS element-separating insulation film, 18 an conductive layer, 19 a first insulation layer, 20 a mask layer, 21 a second insulation layer, 22 a surface protective layer, 23 an conductive layer, 24 a mask layer, 25 an insulation film, 26 a surface protective layer, 27 an conductive layer, 28 a first mask layer, 29 a first insulation layer, 30 a second mask layer, 31 a second insulation layer, 32 a surface protective layer, 100 a $p^{++}$-type silicon semiconductor substrate, 101 a p⁻-type epitaxial layer, 102 an n-type epitaxial layer, 103 an n⁺-type semiconductor region, 104 a LOCOS element-separating insulation film, 105 a mask layer, 106 an insulation layer, 107 a resist film, 108 a surface protective layer, 110 a mask layer, 111-114 represent mask layers, PD1-PD4, PD, PIN represent photodiodes, H represents an opening part, R1-R4 a resist film, and S represents a Laser spot

DESCRIPTION OF THE EMBODIMENTS

For the semiconductor device of the present invention that constitutes plural photodiodes via element-separating regions, even if the opening part is formed in the insulation film in order to improve the sensitivity, since the conductive layer and the mask layer are used as etching stopper, leakage-causing damage can be prevented. Since the conductive layer connected to the second semiconductor layer that constitutes each photodiode is formed in a pattern divided for each photodiode, the photodiodes can be constituted so as to not short circuit.

When the semiconductor device manufacturing method of the present invention is used to manufacture a semiconductor device constituting plural photodiodes via element-separating regions, even if the opening part is formed in the insulation film in order to improve the sensitivity, since the conductive layer and the mask layer are used as etching stopper, leakage-causing damage can be prevented. Since the conductive layer connected to the second semiconductor layer that constitutes each photodiode is formed in a pattern divided for each photodiode, the photodiodes can be constituted so as to not short circuit.

In the following, the embodiments of the semiconductor device disclosed in the present invention will be explained based on figures.

First Embodiment

Figure 1A:
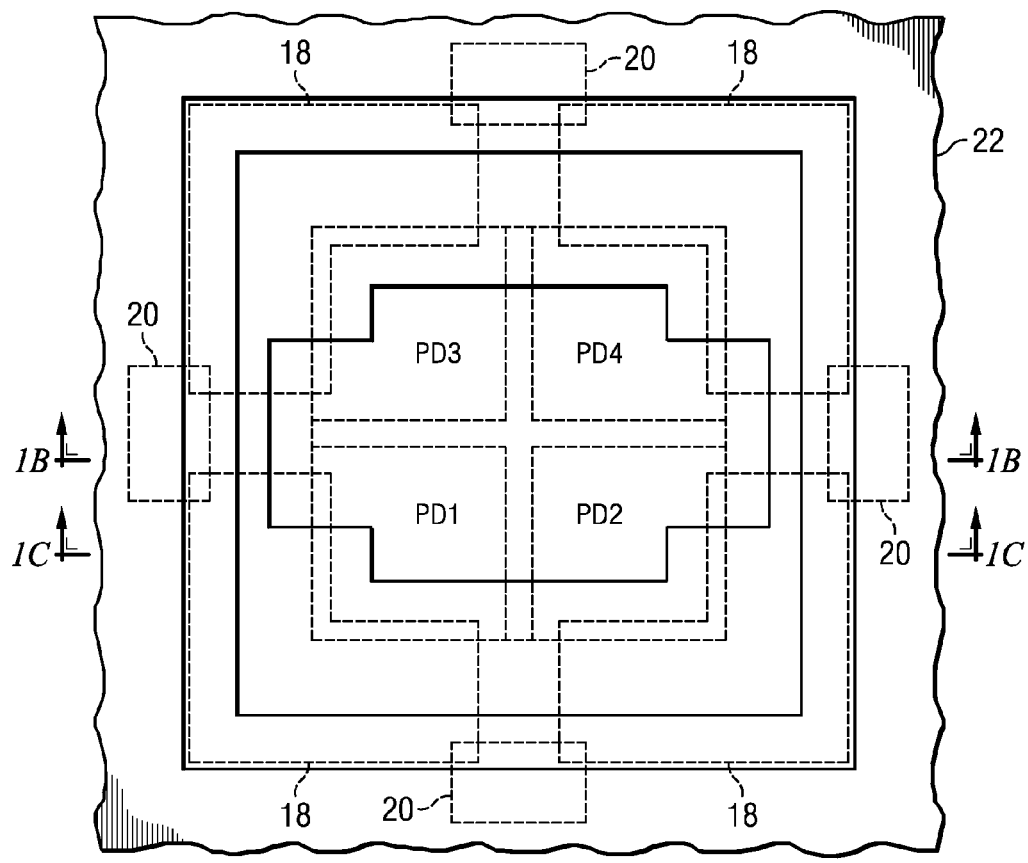
FIG. 1(A) is a plan view of the semiconductor device disclosed in the first embodiment of the present invention.
Figure 1B:
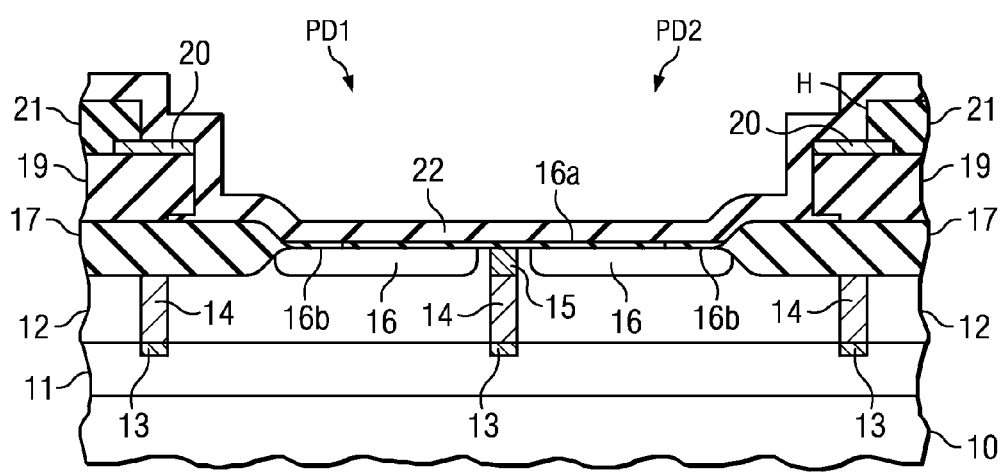
FIG. 1(B) is the cross-sectional as shown in FIG. 1(A).
Figure 1C:
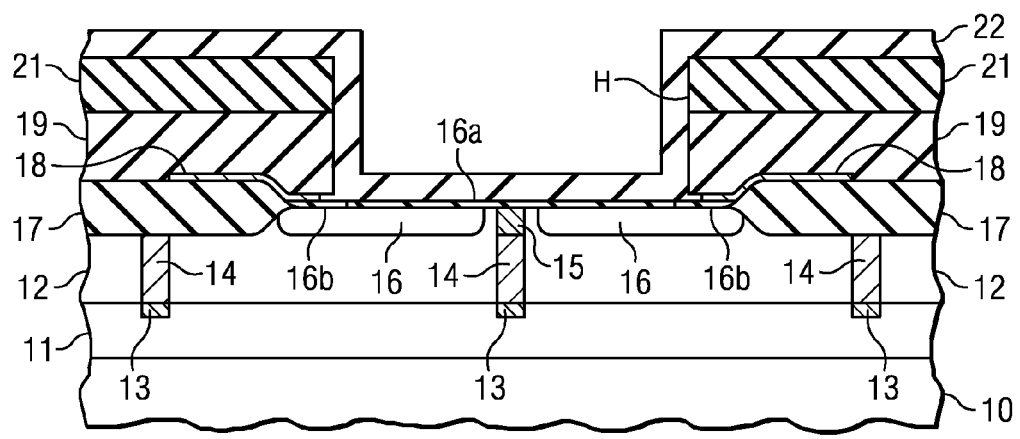
FIG. 1(C) is the cross-sectional view as shown in FIG. 1(A).

The semiconductor device disclosed in this embodiment has four photodiodes formed adjacent to each other and side-by-side via element-separating regions. Its configuration is shown in FIG. 1(A), FIG. 1(B), and FIG. 1(C).

For example, p⁻-type epitaxial layer 11 is formed as Layer I on p⁺⁺-type silicon semiconductor substrate 10, followed by forming n-type epitaxial layer 12 on it to form a pn junction. p⁺⁺-type semiconductor regions (13, 14, 15) are formed from n-type epitaxial layer 12 to the surface layer part of p⁻ type epitaxial layer 11 to divide the device into four PIN photodiode (PD1-PD4) regions. Also, n⁺-type semiconductor region 16 is formed in the surface layer part of n-type epiaixal layer 12 in each of said PIN photodiode (PD1-PD4) regions. Silicon nitride layer 16a is formed on the surface in the central part of n⁺-type semiconductor region 16. Silicide layer 16b made of platinum silicide, etc., is formed on the surface near the edge of n⁺-type semiconductor region 16 in the outer periphery of silicon nitride layer 16a. Silicon nitride layer 16a and silicide layer 16b have a film thickness of, for example, 30 nm.

Also, LOCOS (local oxidation of silicon) element-separating insulation film 17 is formed to surround the four PIN photodiode regions. p⁺⁺-type semiconductor regions (13, 14) are formed below the LOCOS element-separating insulation film to separate the elements.

As described above, the second semiconductor layer of the second conductivity type (n type epitaxial layer 12 and n⁺-type semiconductor region 16) is formed on the main surface of the first semiconductor layer of the first conductivity type (p⁺⁺-type silicon semiconductor substrate 10 and p-type epitaxial layer 11) and is separated by the element-separating regions comprised of p⁺⁺-type semiconductor regions (13, 14, 15) and LOCOS element-separating insulation film 17. In this way, four approximately square-shaped PIN photodiodes (PD1-PD4) are formed adjacent to each other. The outer periphery of the entire device has an approximately square shape.

Each PIN photodiode (D1-PD4) side is, for example, approximately several μm to tens of μm. Each side of the approximately square device comprised of the four integrated photodiodes is, for example, about 40 μm. Also, the intervals between the PIN photodiodes are reduced to about 5 μm or less.

Conductive layer 18 made of Al/TiW or other metal is formed via silicide layer 16b on n⁺-type semiconductor region 16 in a pattern, which is connected to n⁺-type semiconductor region 16 that forms the second semiconductor layer along the outer periphery with respect to all of said four PIN photodiodes (PD1-PD4), and which is divided for each of PIN photodiodes (PD1-PD4).

In other words, each PIN photodiode (PD1-PD4) has an approximately square shape, and conductive layer 18 is formed in a pattern connected to n⁺-type semiconductor region 16 via silicide layer 16b on the two sides of each square.

The first insulation layer 19 made of silicon oxide, etc., is formed on the entire surface to cover conductive layer 18. Also, mask layer 20 made of TiN/Al/TiN, for example, is formed in the region outside conductive layer 18 on the first insulation layer 16 in a pattern having regions superposed with two conductive layer 18 formed on two adjacent PIN photodiodes.

Then, the second insulation layer 21 made of silicon oxide, etc., is formed on the entire surface to cover mask layer 20. An opening part H that reaches silicon nitride layer 16a and silicide layer 16b on n⁺-type semiconductor region 16 that forms the second semiconductor layer is formed in the first insulation layer 19 and the second insulation layer 21 in the region within the patterns of conductive layer 18 and mask layer 20. Also, a surface protective layer is formed to cover opening part H.

When an inverse bias is applied to n⁺-type semiconductor region 16 and p⁻ type epitaxial layer 11 in the four PIN photodiodes (PD1-PD4) with the aforementioned configuration, the depletion layer is widened from the pn junction surface. When light is incident on the formed depletion layer, electron-hole pairs are generated to obtain optical signals.

In this case, since conductive layer 18 is connected to n⁺-type semiconductor region 16 via silicide layer 16b, a voltage can be applied to n⁺-type semiconductor region 16 via conductive layer 18.

Although the aforementioned first and second insulation films attenuate the light incident on each PIN photodiode (PD1-PD4), said attenuation can be avoided by forming opening part H.

In the following, the method of manufacturing the semiconductor device disclosed in the aforementioned embodiment will be explained.

Figure 2A:
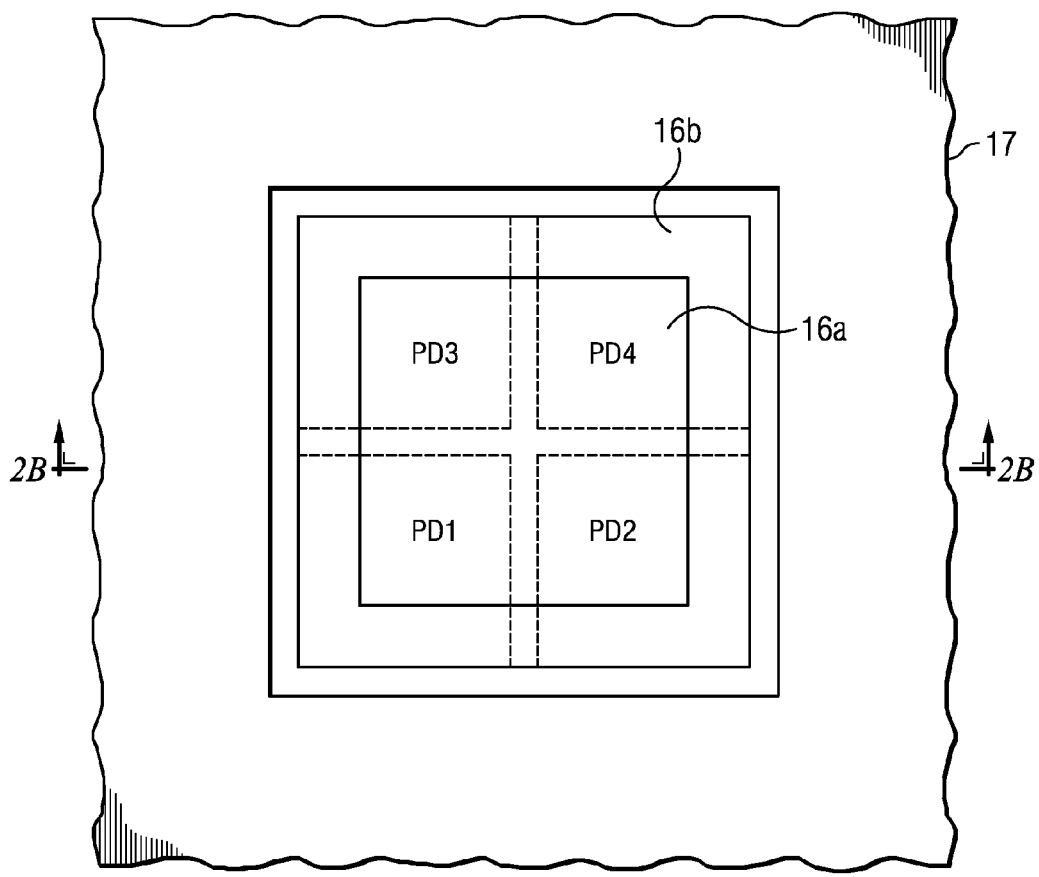
FIG. 2(A) is a plan view illustrating the manufacturing process of the semiconductor device disclosed in the first embodiment of the present invention.
Figure 2B:
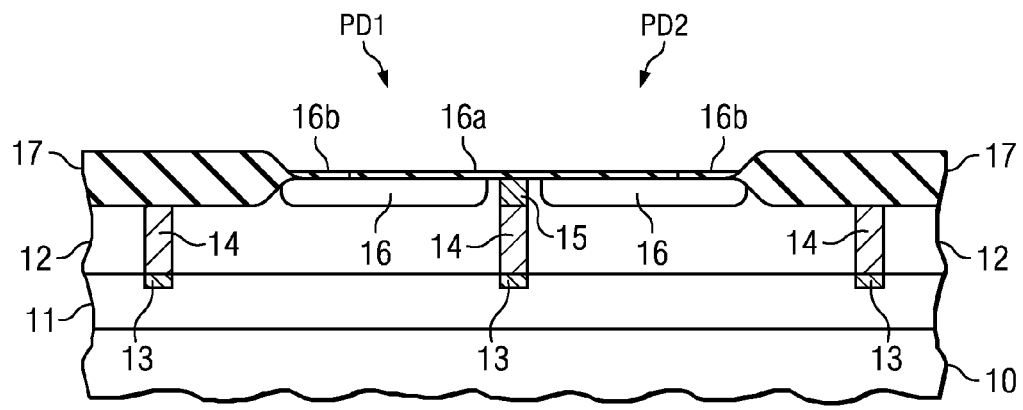
FIG. 2(B) is the cross-sectional view as shown in FIG. 2(A).

First, as shown in FIG. 2(A) and FIG. 2(B, p-type epitaxial layer 11 and n-type epitaxial layer 12 are formed as Layer I by means of epitaxial growth method on p⁺⁺-type silicon semiconductor substrate 10.

A p-type impurity is introduced before and after the aforementioned epitaxial growth to form p⁺⁺-type semiconductor regions (13, 14). Then, LOCOS element-separating insulation film 17 is formed to separate the elements. Also, in the surface layer part of n-type epitaxial layer 12, p⁺⁺-type semiconductor region 15 is formed to connect with p$^{++}$-type semiconductor regions (13, 14) by introducing a p-type impurity, and n$^+$-type semiconductor region 16 is formed by introducing an n-type impurity. Silicon nitride layer 16a is formed in a thickness of about 30 nm on the surface in the central part of n$^+$-type semiconductor region 16. With silicon nitride layer 16a having a silicide-preventing function used as a mask, silicide layer 16b made of platinum silicide, etc., is formed in a thickness of about 30 nm on the surface near the edge of n$^+$-type semiconductor region 16 along the outer periphery of silicon nitride layer 16a.

In this way, four PIN photodiodes (PD1-PD4) having an approximately square shape are formed adjacent to each other.

Said PIN photodiodes (PD1-PD4) are separated from each other by p$^{++}$-type semiconductor regions 13, 14, 15 formed in a cross shape.

Figure 3A:
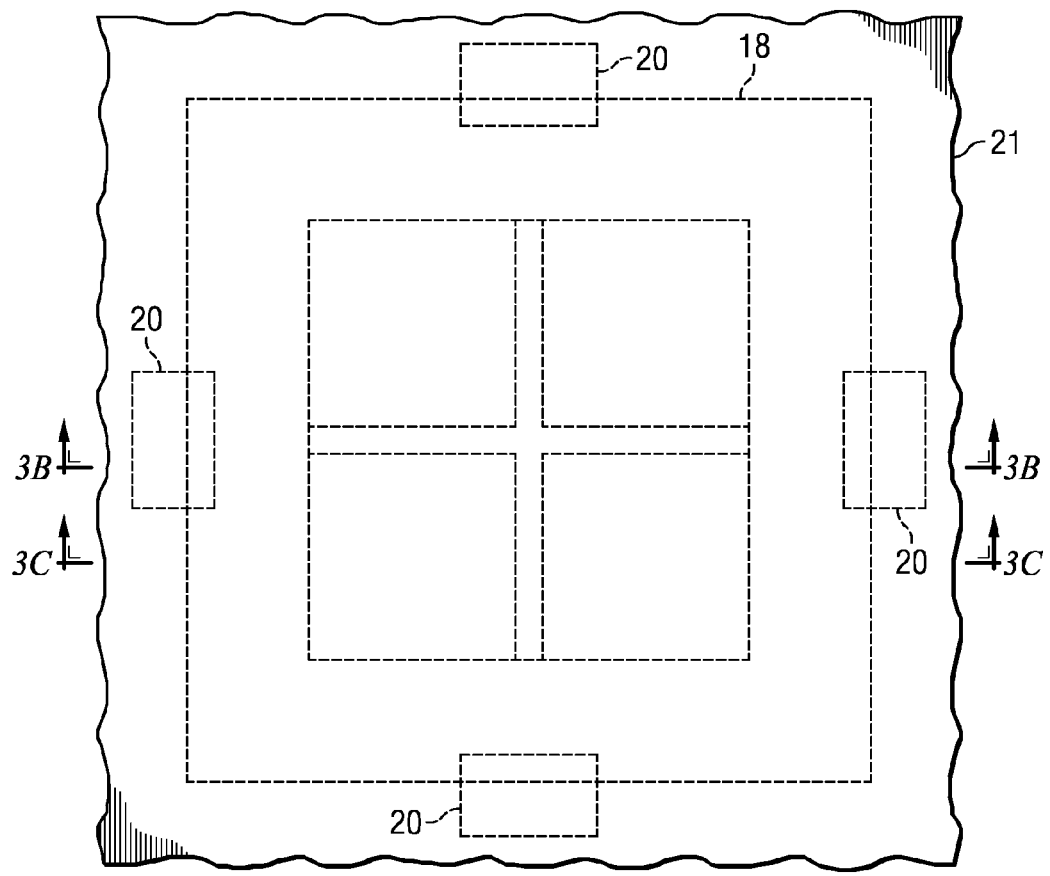
FIG. 3(A) is a plan view illustrating the manufacturing process of the semiconductor device disclosed in the first embodiment of the present invention.
Figure 3B:
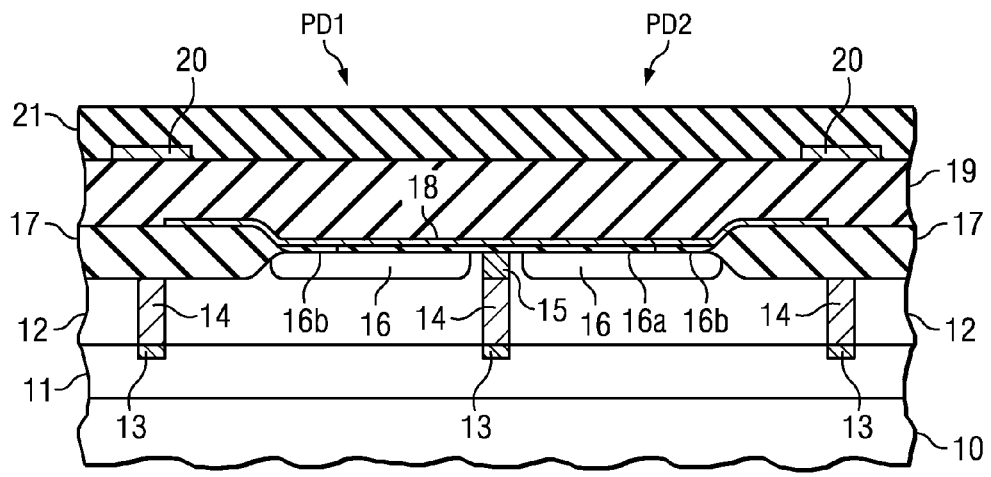
FIG. 3(B) is the cross-sectional as shown in FIG. 3(A).
Figure 3C:
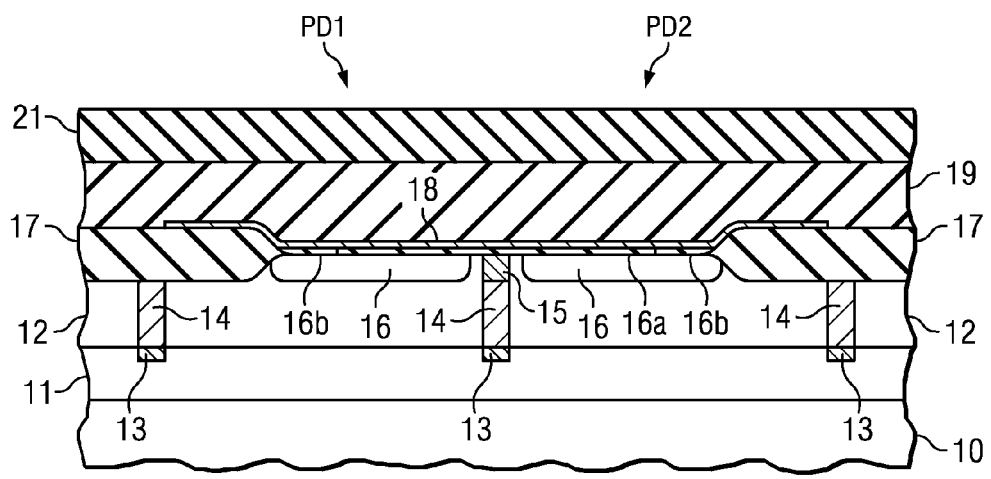
FIG. 3(C) is the cross-sectional view as shown in FIG. 3(A).

Then, as shown in FIG. 3(A), FIG. 3(B) and FIG. 3(C), which is the cross-sectional view along Y-Y', a metal layer made of Al/TiW, etc., is deposited in a thickness of 200-300 nm to cover silicon nitride layer 16a and silicide layer 16b on n$^+$-type semiconductor region 16, followed by patterning to cover all of the four PIN photodiodes (PD1-PD4) to form conductive layer 18.

In this case, the material of conductive layer 18 is not limited to the Al/TiW layer. Any material can be used as long as it is a removable material with selection ratio with respect to silicon nitride layer 16a and silicide layer 16b as well as the first insulation film 19 and the second insulation film 20 to be formed later.

Then, the first insulation film 19 is formed on the entire surface to cover conductive layer 18. The first insulation film 19 is formed as a single layer or as plural laminated layers by depositing silicon oxide using CVD (chemical vapor deposition) with TEOS (tetraethyl orthosilicate) used as raw material, or by depositing a BPSG (silicon oxide film containing phosphorous and boron) film, or by depositing silicon nitride using CVD.

Then, TiN/Al/TiN, etc., is deposited in a thickness of 200-300 nm on the first insulation film 19 by sputtering, for example, followed by patterning to form mask layer 20 having regions superposed with conductive layer 18 in the region outside conductive layer 18 in the extended part of the element-separating region between two adjacent PIN photodiodes.

Like the first insulation film 19, the second insulation film 20 is formed on the entire surface to cover mask layer 20.

Figure 4A:
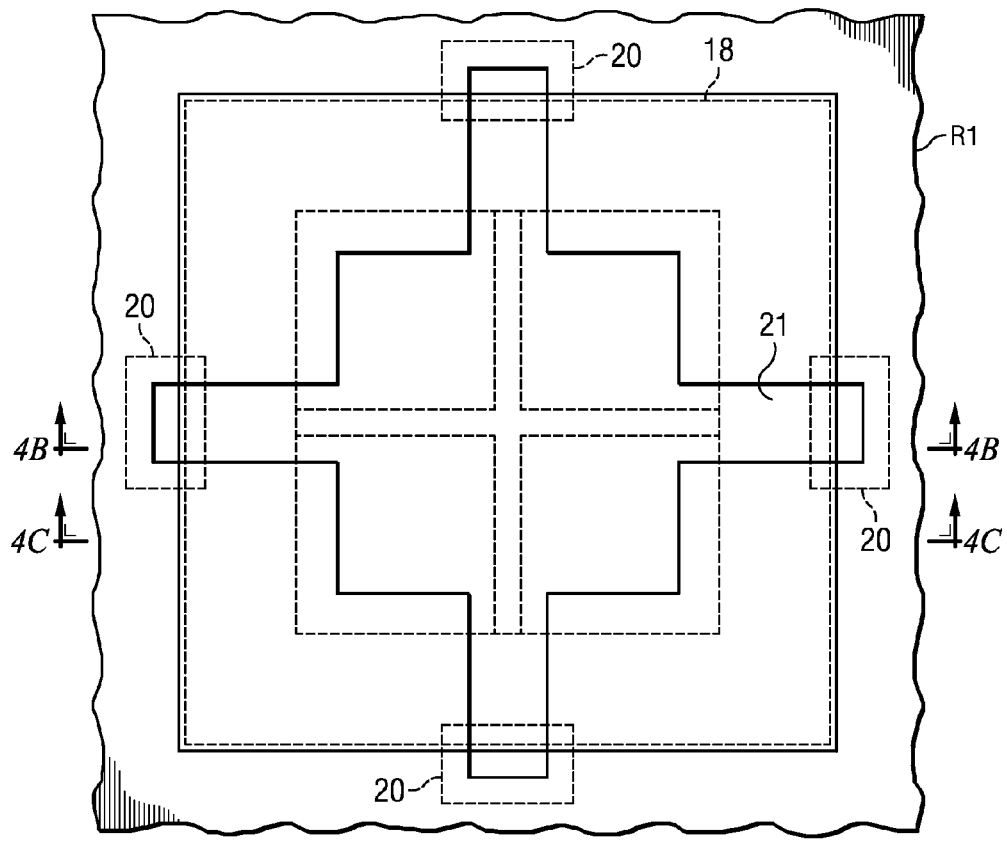
FIG. 4(A) is a plan view illustrating the manufacturing process of the semiconductor device disclosed in the first embodiment of the present invention.
Figure 4B:
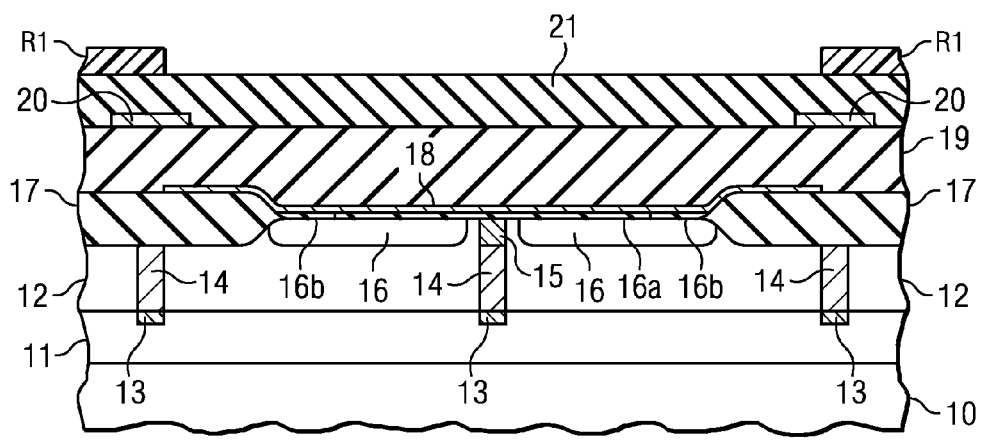
FIG. 4(B) is the cross-sectional view as shown in FIG. 4(A).
Figure 4C:
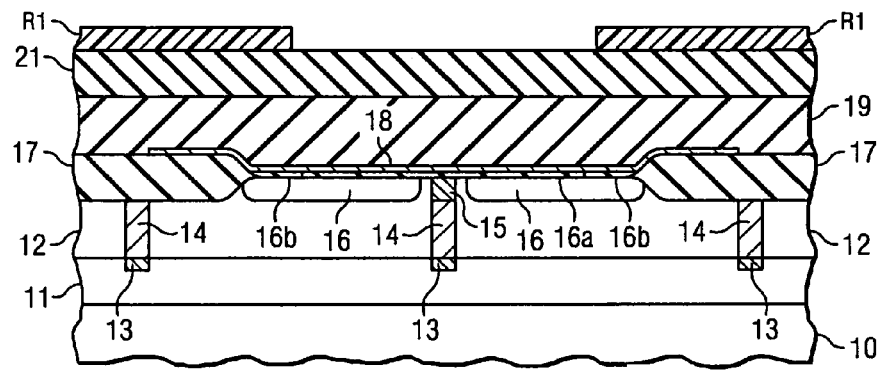
FIG. 4(C) is the cross-sectional view as shown in FIG. 4(A).

Then, as shown in FIG. 4(A), FIG. 4(B and FIG. 4(C), resist film R1 is formed in such a pattern that conductive layer 18 and/or mask layer 20 is present at any position in the opening region.

Figure 5A:
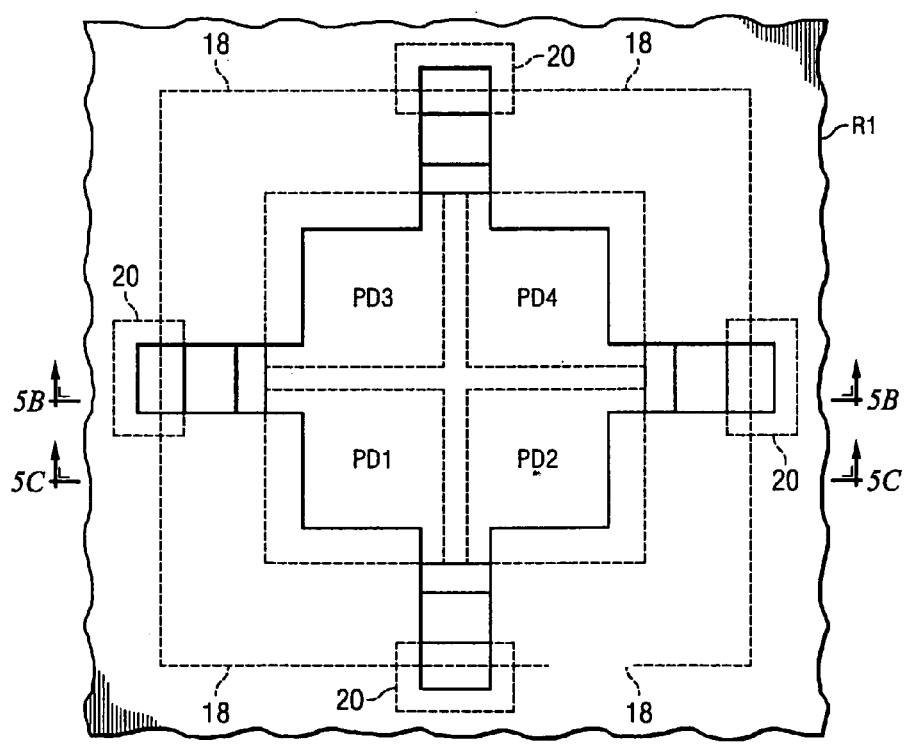
FIG. 5(A) is a plan view illustrating the manufacturing process of the semiconductor device disclosed in the first embodiment of the present invention.
Figure 5B:
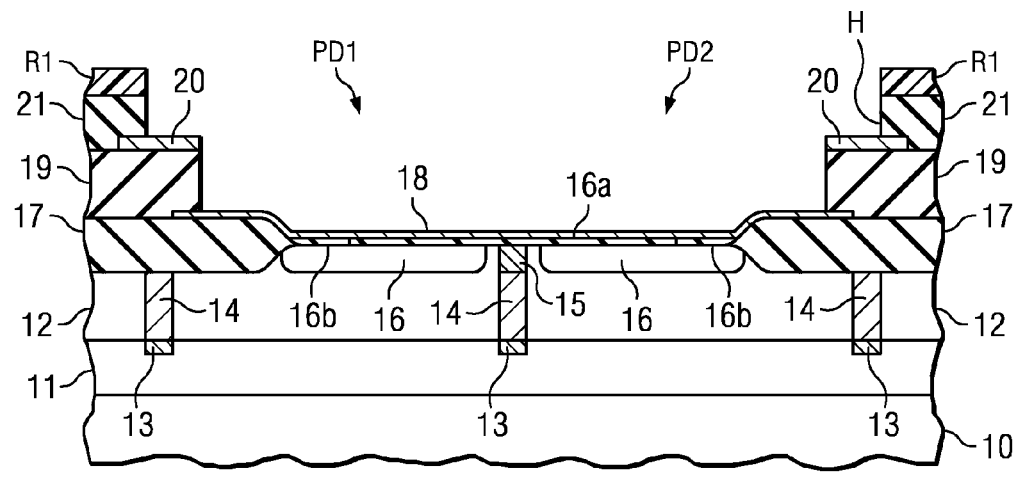
FIG. 5(B) is the cross-sectional view as shown in FIG. 5(A).
Figure 5C:
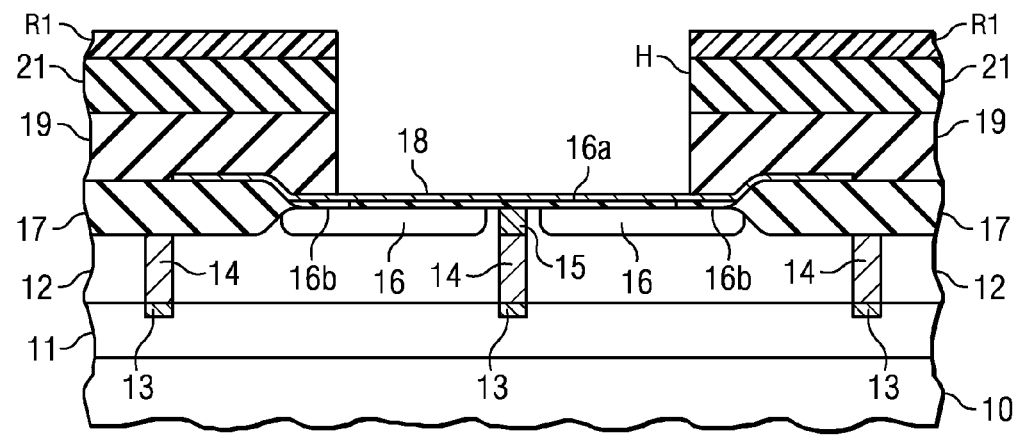
FIG. 5(C) is the cross-sectional view as shown in FIG. 5(A).

Then, as shown in FIG. 5(A), FIG. 5(B) and FIG. 5(C), dry etching, such as reactive ion etching, is performed as the first etching with conductive layer 18 and mask layer 20 used as etching stopper to form opening part H, which exposes conductive layer 18 and mask layer 20, in the first insulation layer 19 and the second insulation layer 21.

In this case, the opening region of resist film R1 extends to the outside of the region where conductive layer 18 is formed. If there is no mask layer 20, the opening part H will form a tunnel in element-separating insulation film 17. However, since mask layer 20 stops the etching, the aforementioned problem will not occur.

Figure 6A:
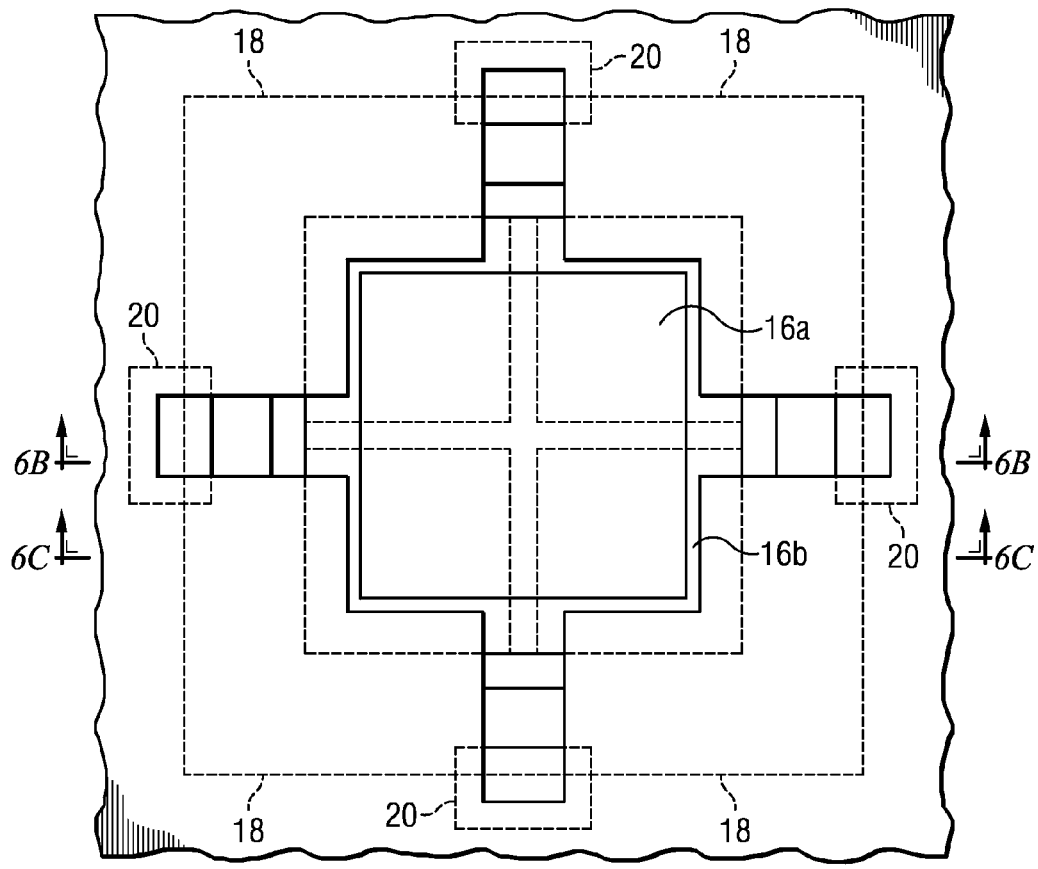
FIG. 6(A) is a plan view illustrating the manufacturing process of the semiconductor device disclosed in the first embodiment of the present invention.
Figure 6B:
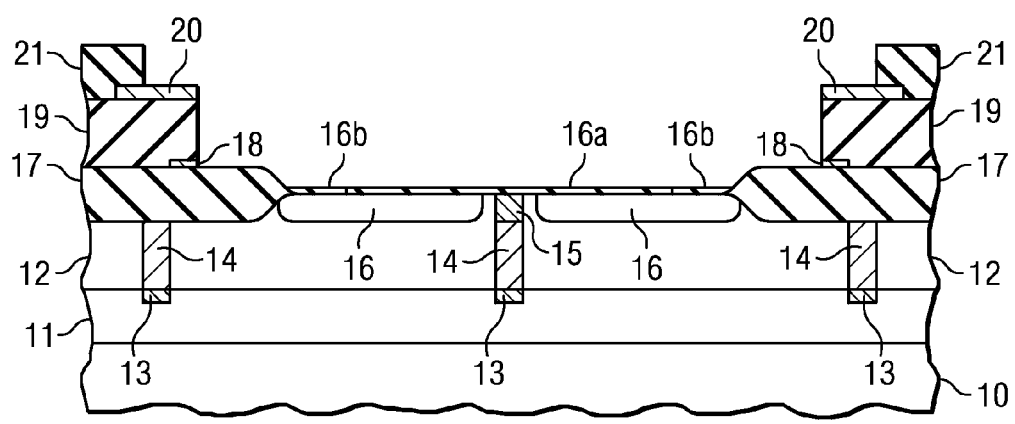
FIG. 6(B) is the cross-sectional view as shown in FIG. 6(A).
Figure 6C:
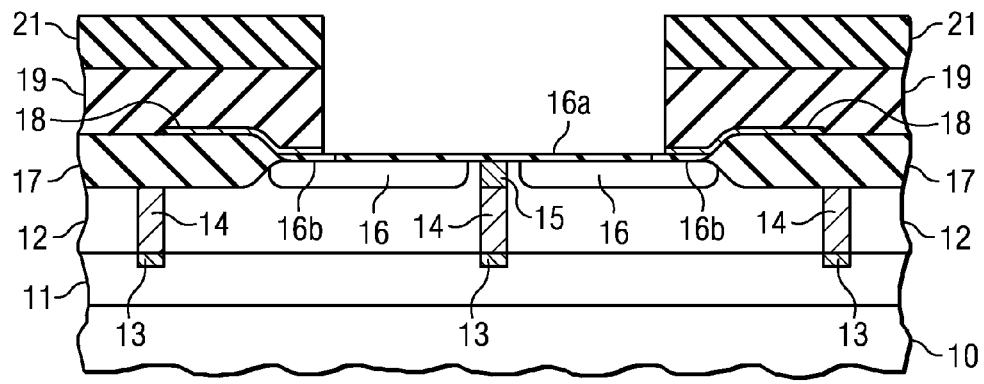
FIG. 6(C) is the cross-sectional view as shown in FIG. 6(A).

Then, in of FIG. 6(A), FIG. 6(B) and FIG. 6(C), which is the cross-sectional view along Y-Y', for example, after resist film R1 is removed, wet etching is performed as second etching, with the first insulation film 19 and the second insulation film 20 used as an etching mask, to remove conductive layer 18. In this case, the etching solution used is such that mask layer 20 remains.

As a result of the aforementioned etching, conductive layer 18 is formed in a pattern, which is connected to n$^+$-type semiconductor region 16 that forms the second semiconductor layer along the outer periphery with respect to the four PIN photodiodes (PD1-PD4), and which is divided for each of the PIN photodiodes (PD1-PD4). However, since conductive layer 18 remains untouched in the region superposed with mask layer 20, [the photodiodes] are connected to each other as one body by the conductive layer 18 in that region.

Figure 7A:
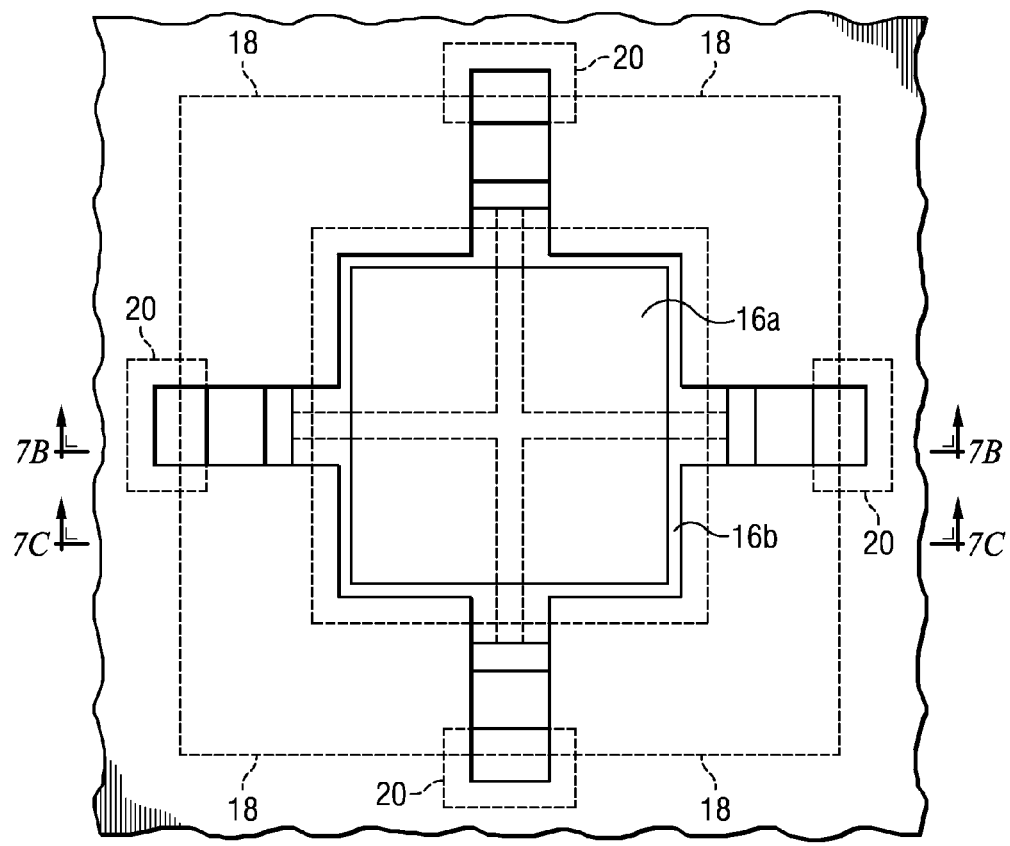
FIG. 7(A) is a plan view illustrating the manufacturing process of the semiconductor device disclosed in the first embodiment of the present invention.
Figure 7B:
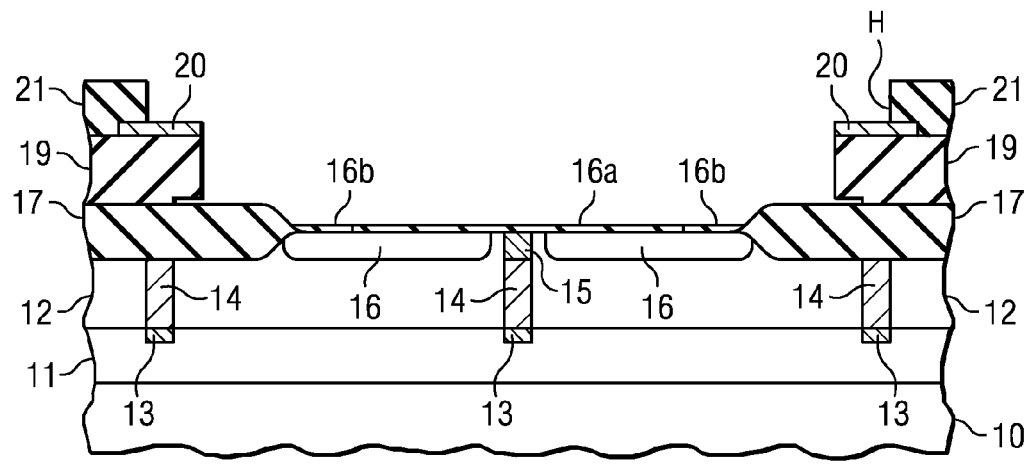
FIG. 7(B) is the cross-sectional view as shown in FIG. 7(A).
Figure 7C:
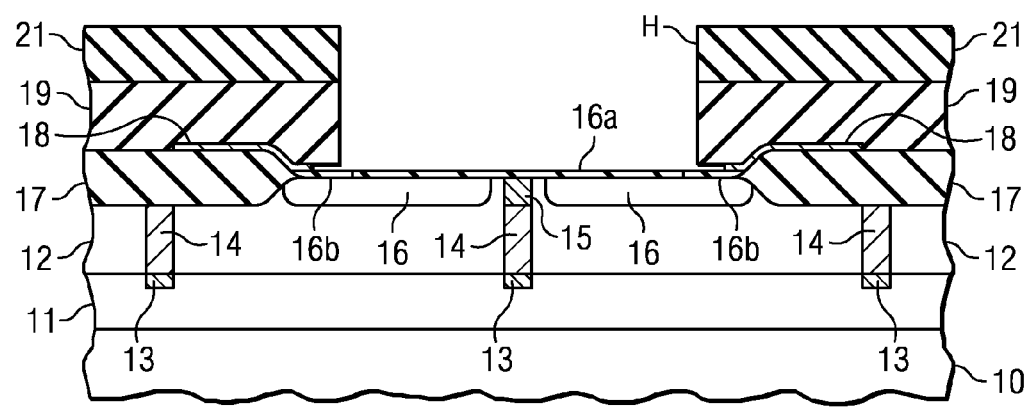
FIG. 7(C) is the cross-sectional view as shown in FIG. 7(A).

Then, as shown in FIG. 7(A), FIG. 7(B) and FIG. 7(C), which is the cross-sectional view along Y-Y', over-etching is performed during the aforementioned second etching to also carry out etching in the horizontal direction to recess conductive layer 18. In this way, the conductive layer 18 in the region superposed with mask layer 20 is removed. Conductive layer 18 is formed in a pattern, which is connected to n$^+$-type semiconductor region 16 that forms the second semiconductor layer along the outer periphery with respect to the four PIN photodiodes (PD1-PD4), and which is divided for each of the PIN photodiodes (PD1-PD4).

After that, an insulation film made of silicon nitride, etc., is deposited on the entire surface by means of CVD to form surface protective layer 22. In this way, the semiconductor device disclosed in the embodiment shown in FIGS. 1(A)-(C) can be manufactured.

For the semiconductor device disclosed in the aforementioned embodiment, even if the opening part is formed in the insulation film in order to improve the sensitivity as described in this manufacturing method, since the conductive layer and the mask layer are used as etching stopper, leakage-causing damage can be prevented. Since the conductive layer connected to the second semiconductor layer that constitutes each photodiode is formed in a pattern divided for each photodiode, the photodiodes can be constituted so as to not short circuit.

In the aforementioned embodiment, the etching solution used is such that mask layer 20 is not removed during the second etching. However, it is also possible to remove conductive layer 18 and mask layer 20 at the same time.

Second Embodiment

Figure 8A:
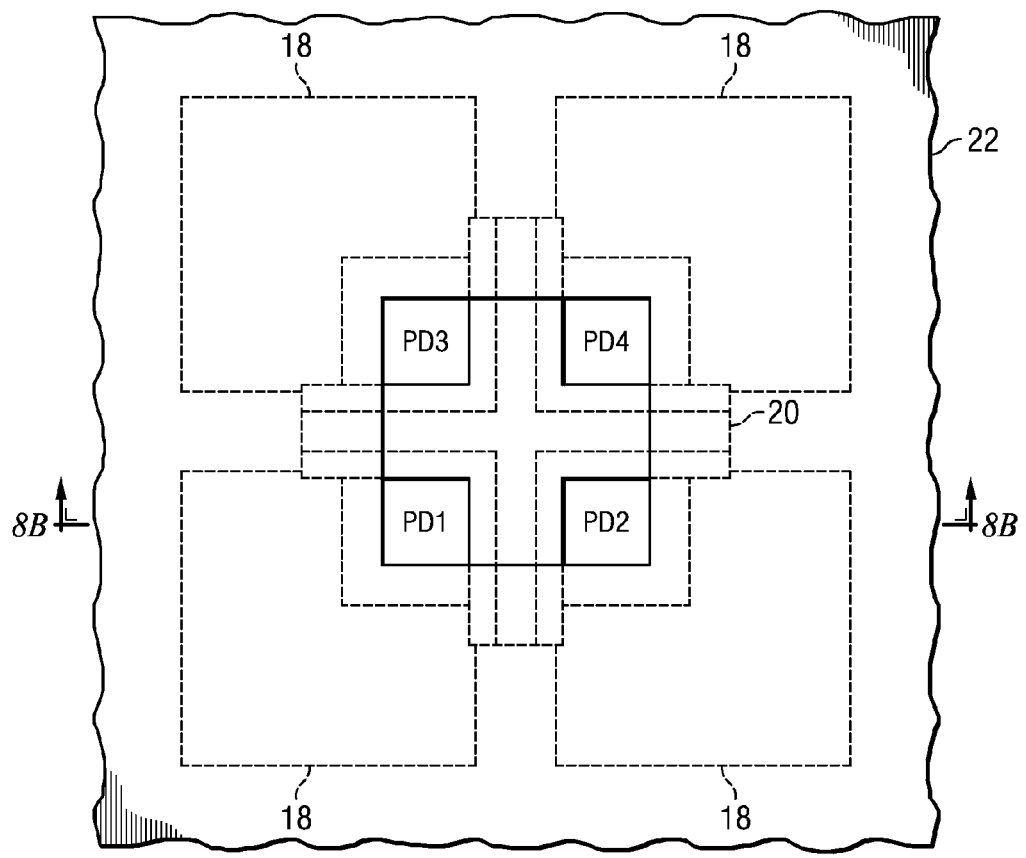
FIG. 8(A) is a plan view of the semiconductor device disclosed in the second embodiment of the present invention.
Figure 8B:
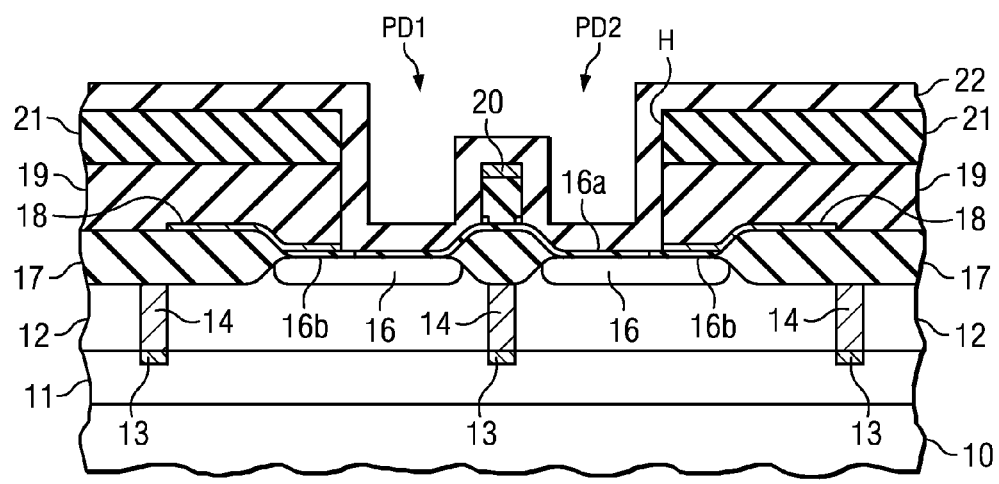
FIG. 8(B) is the cross-sectional view as shown in FIG. 8(A).

The semiconductor device disclosed in this embodiment has four photodiodes formed adjacent to each other via element-separating regions in the same way as described in the first embodiment. Its configuration is shown in FIG. 8(A) and FIG. 8(B).

Four PIN photodiodes (PD1-PD4) are formed in the same way as described in the first embodiment. In this embodiment, however, LOCOS element-separating insulation film 17 is also formed in the regions that separate the four PIN photodiodes (PD1-PD4).

The second semiconductor layer of the second conductivity type (n type epitaxial layer 12 and n$^+$-type semiconductor region 16) is formed on the main surface of the first semiconductor layer of the first conductivity type (p$^{++}$-type silicon semiconductor substrate 10 and p$^-$-type epitaxial layer 11). Silicon nitride layer 16a is formed on the surface at the central part of n$^+$-type semiconductor region 16. Silicide layer 16b made of platinum silicide, etc., is formed on the surface near the edge of n$^+$-type semiconductor region 16a, which is the outer periphery of silicon nitride layer 16. The device is separated by element-separating regions comprised of p$^{++}$-type semiconductor regions (13, 14) and LOCOS element-separating insulation film 17. In this way, four approximately square PIN photodiodes (PD1-PD4) are formed adjacent to each other. The outer periphery of the entire device has an approximately square shape.

Each PIN photodiode (PD1-PD4) side is, for example, approximately several μm to tens of μm. Each side of the approximately square device comprised of the four integrated photodiodes is, for example, about 40 μm. Also, the intervals between the PIN photodiodes are reduced to about 5 μm or less.

Conductive layer 18 made of Al/TiW or other metal is formed via silicide layer 16b on $n^+$-type semiconductor region 16 in a pattern, which is connected to $n^+$-type semiconductor region 16 that forms the second semiconductor layer along the outer periphery with respect to all of said four PIN photodiodes (PD1-PD4), and which is divided for each of PIN photodiodes (PD1-PD4).

In other words, each of PIN photodiodes (PD1-PD4) has an approximately square shape, and conductive layer 18 is formed in a pattern connected to $n^+$-type semiconductor region 16 via silicide layer 16b on the two sides of each square.

In this case, conductive layer 18 is also formed on the element-separating regions between the adjacent PIN photodiodes.

The first insulation layer 19 made of silicon oxide, etc., is formed on the entire surface to cover conductive layer 18. Also, mask layer 20 made of TiN/Al/TiN, for example, is formed on the first insulation layer 19 in a pattern having regions superposed with conductive layer 18 on the element-separating region between the adjacent PIN photodiodes.

In this case, the four PIN photodiodes (PD1-PD4) are separated by a cross-shaped element-separating region. The mask layer 20 formed in this region is also formed in a cross shape.

Then, the second insulation layer 21 made of silicon oxide, etc., is formed on the first insulation film 19. An opening part H, which reaches silicon nitride layer 16a and silicide layer 16b on $n^+$-type semiconductor region 16 that forms the second semiconductor layer, is formed in the first insulation layer 19 and the second insulation layer 21 in the region surrounded by the pattern of conductive layer 18 and mask layer 20 on the inner side of conductive layer 18. The second insulation film 21 is completely removed in the opening part H. The first insulation film 19 is also removed except for the part below mask layer 20.

Also, a surface protective layer 22 is formed to cover the area inside opening part H.

For the four PIN photodiodes (PD1-PD4) with the aforementioned configuration, since conductive layer 18 is connected to $n^+$-type semiconductor region 16 via silicide layer 16b, a voltage can be applied to $n^+$-type semiconductor region 16 via conductive layer 18.

In the following, the method of manufacturing the semiconductor device disclosed in the aforementioned embodiment will be explained.

Figure 9A:
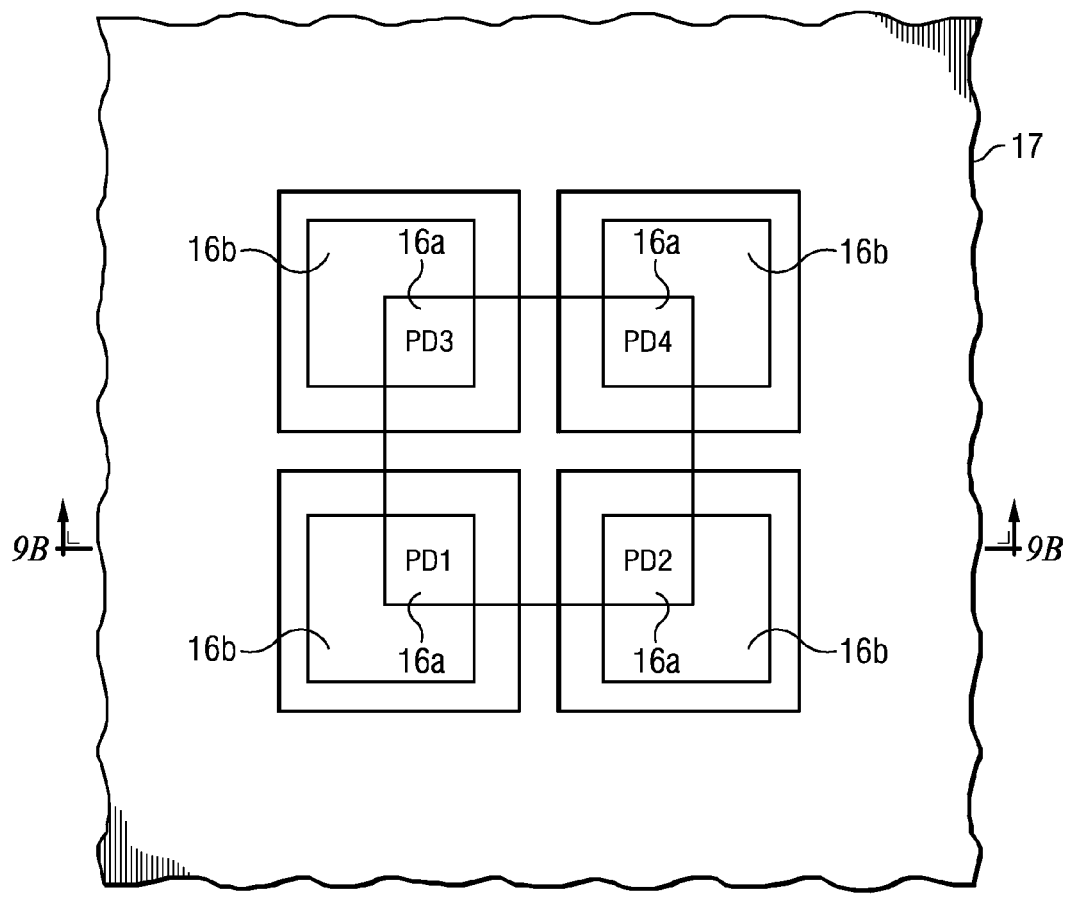
FIG. 9(A) is a plan view illustrating the manufacturing process of the semiconductor device disclosed in the second embodiment of the present invention.
Figure 9B:
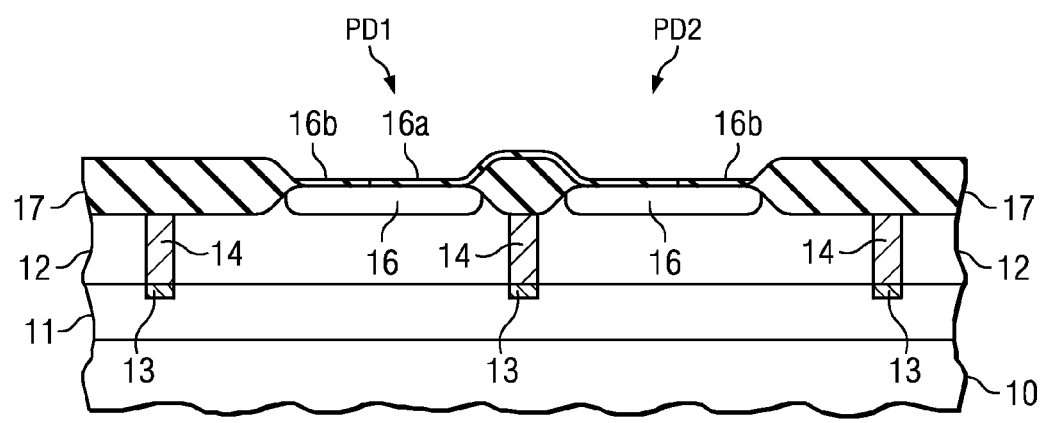
FIG. 9(B) is the cross-sectional view as shown in FIG. 9(A).

First, as shown in FIG. 9(A) and FIG. 9(B), four approximately square-shaped PIN photodiodes (PD1-PD4) are formed adjacent to each other in the same way as described in the first embodiment. In this case, however, LOCOS element-separating insulation film 17 is also formed in the region that separates the four PIN photodiodes (PD1-PD4).

Figure 10A:
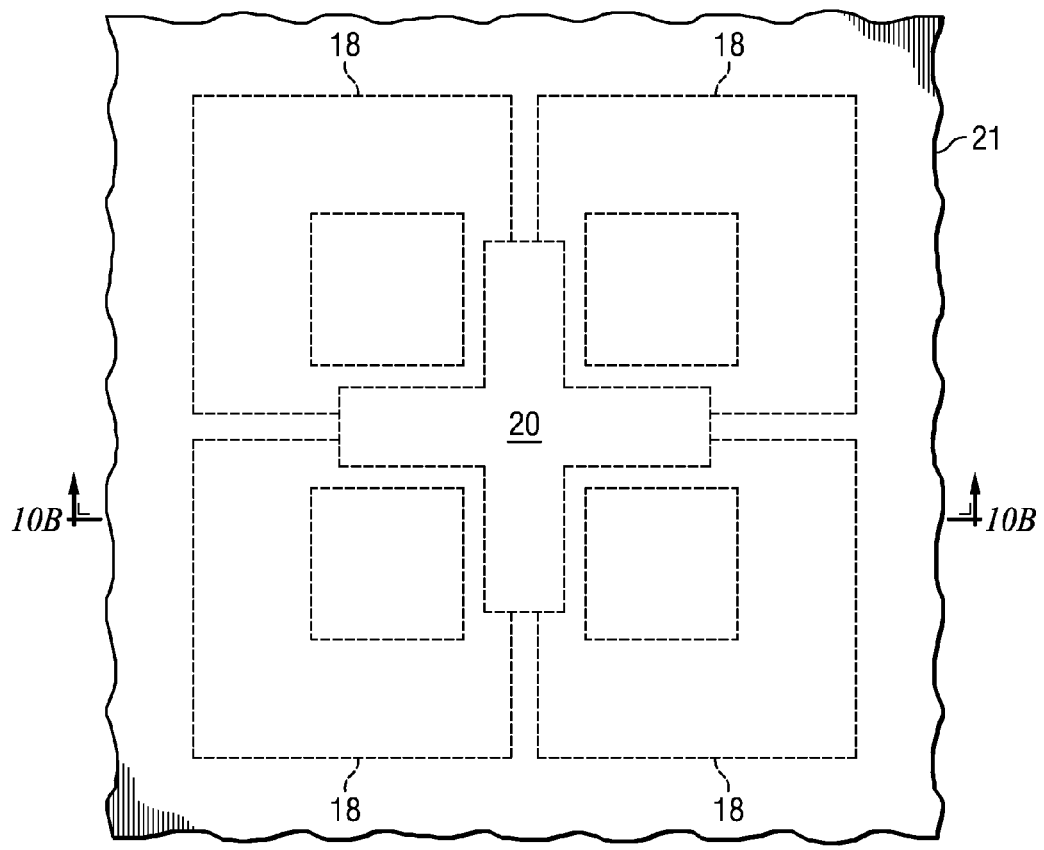
FIG. 10(A) is a plan view illustrating the manufacturing process of the semiconductor device disclosed in the second embodiment of the present invention.
Figure 10B:
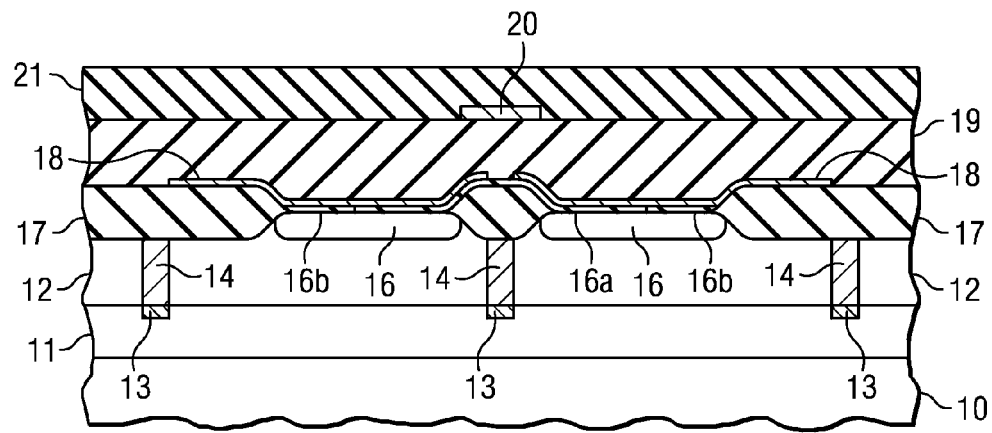
FIG. 10(B) is the cross-sectional view as shown in FIG. 10(A).

Then, as shown in FIG. 10(A) and FIG. 10(B), a metal layer of Al/TiW, etc., is deposited by means of sputtering, for example, in a thickness of 200-300 nm on the entire surface to cover silicon nitride layer 16a and silicide layer 16b on $n^+$-type semiconductor region 16, followed by patterning to form conductive layer 18, which is separated for each of the four PIN photodiodes (PD1-PD4) and covers up to the area on the element-separating region between the adjacent PIN photodiodes.

Then, the first insulation film 19 is formed on the entire surface to cover conductive layer 18. The first insulation film 19 is formed as a single layer or as plural laminated layers by depositing silicon oxide by CVD with TEOS used as the raw material, or by depositing a BPSG film, or by depositing silicon nitride by CVD.

Then, TiN/Al/TiN, etc., is deposited in a thickness of 200-300 nm on the first insulation film 19 by sputtering, for example, followed by patterning to form mask layer 20 having regions superposed with conductive layer 18 on the element-separating region between the adjacent PIN photodiodes.

Like the first insulation film 19, the second insulation film 21 is formed on the entire surface to cover mask layer 20.

Figure 11A:
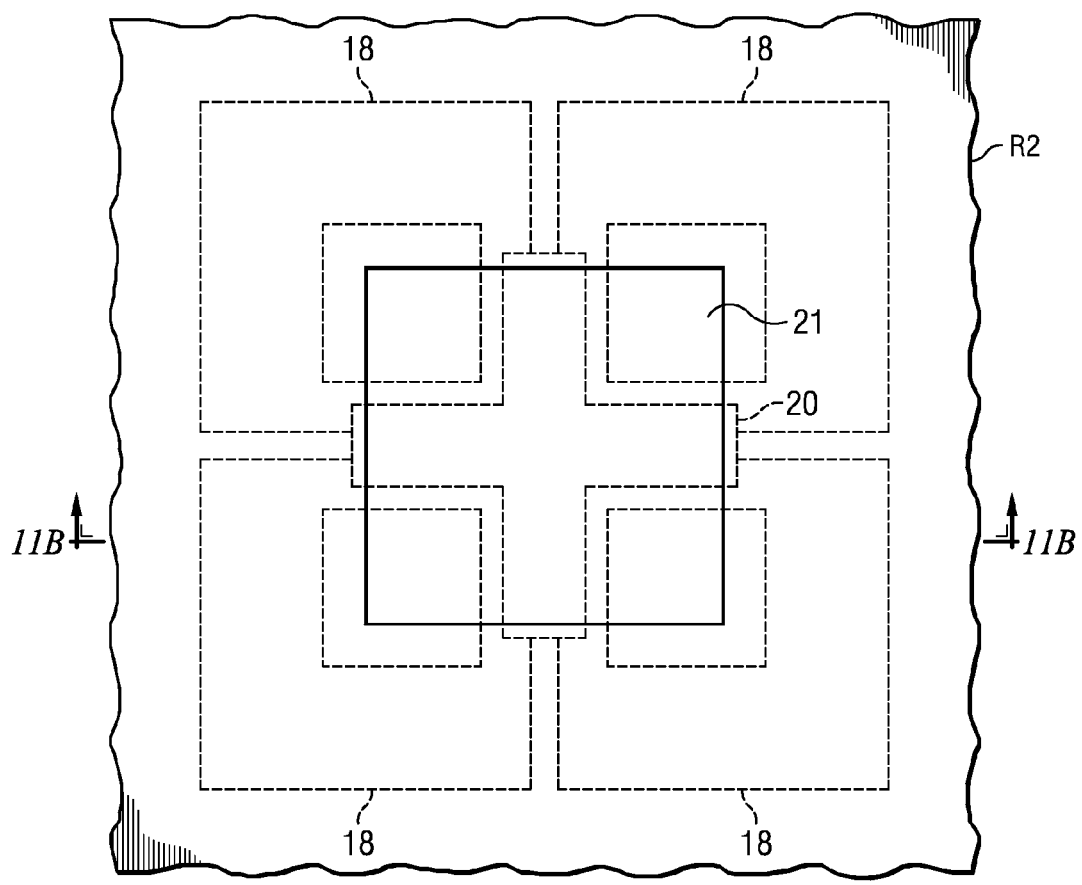
FIG. 11(A) is a plan view illustrating the manufacturing process of the semiconductor device disclosed in the second embodiment of the present invention.
Figure 11B:
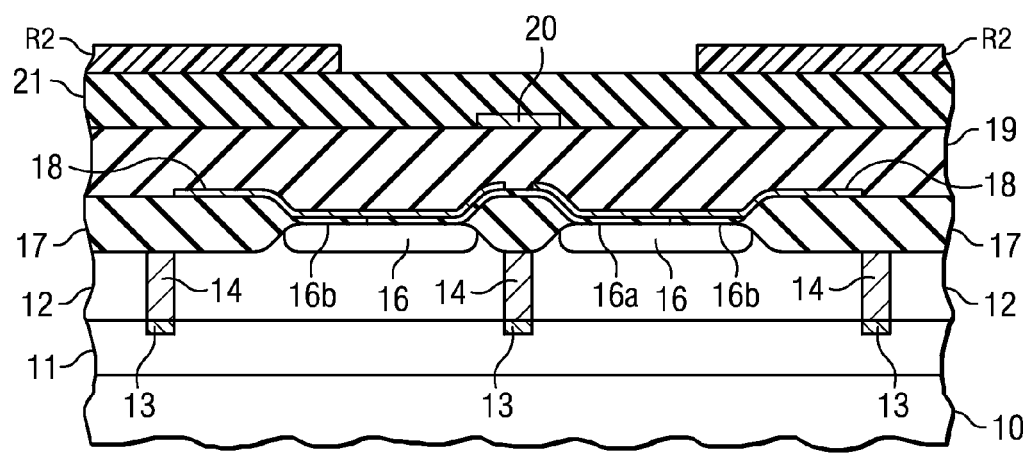
FIG. 11(B) is the cross-sectional view as shown in FIG. 11(A).

Then, as shown in FIG. 11(A) and FIG. 11(B), resist film R2 is formed in such a pattern that conductive layer 18 and/or mask layer 20 is present at any position in the opening area.

Figure 12A:
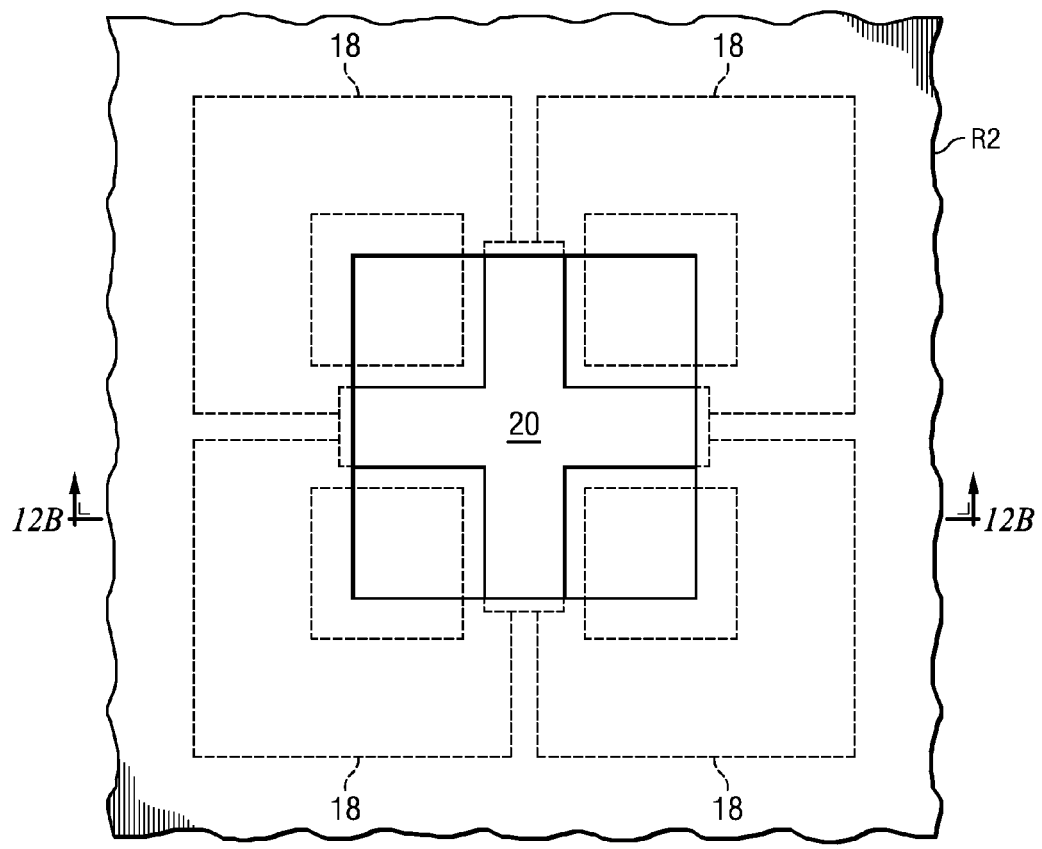
FIG. 12(A) is a plan view illustrating the manufacturing process of the semiconductor device disclosed in the second embodiment of the present invention.
Figure 12B:
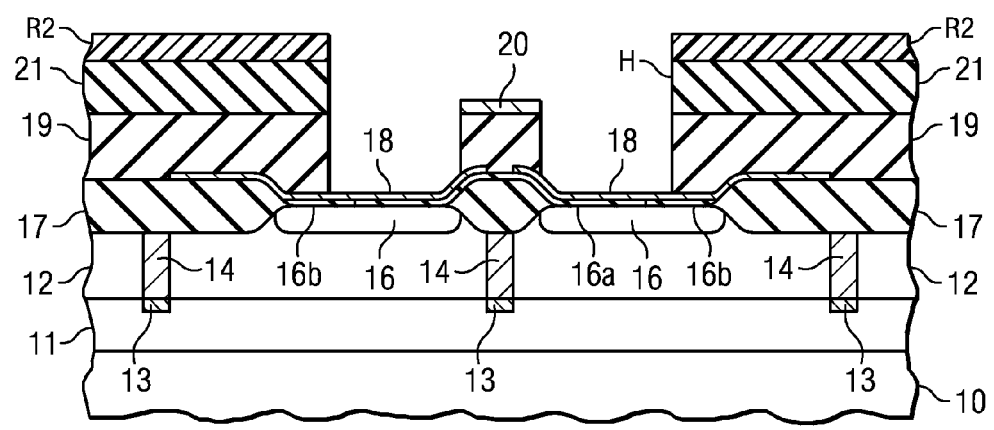
FIG. 12(B) is the cross-sectional view as shown in FIG. 12(A).

Then, as shown in FIG. 12(A) and FIG. 12(B), for example, dry etching, such as reactive ion etching, is performed as the first etching with conductive layer 18 and mask layer 20 used as etching stopper to form opening part H, which exposes conductive layer 18 and mask layer 20, in the first insulation layer 19 and the second insulation layer 21.

In this case, there is a region where conductive layer 18 is not formed on the element-separating region between the PIN photodiodes in the opening region of resist film R2. If there is no mask layer 20, the opening part H will form a tunnel in element-separating insulation film 17. However, since mask layer 20 stops the etching, the aforementioned problem will not occur.

Figure 13A:
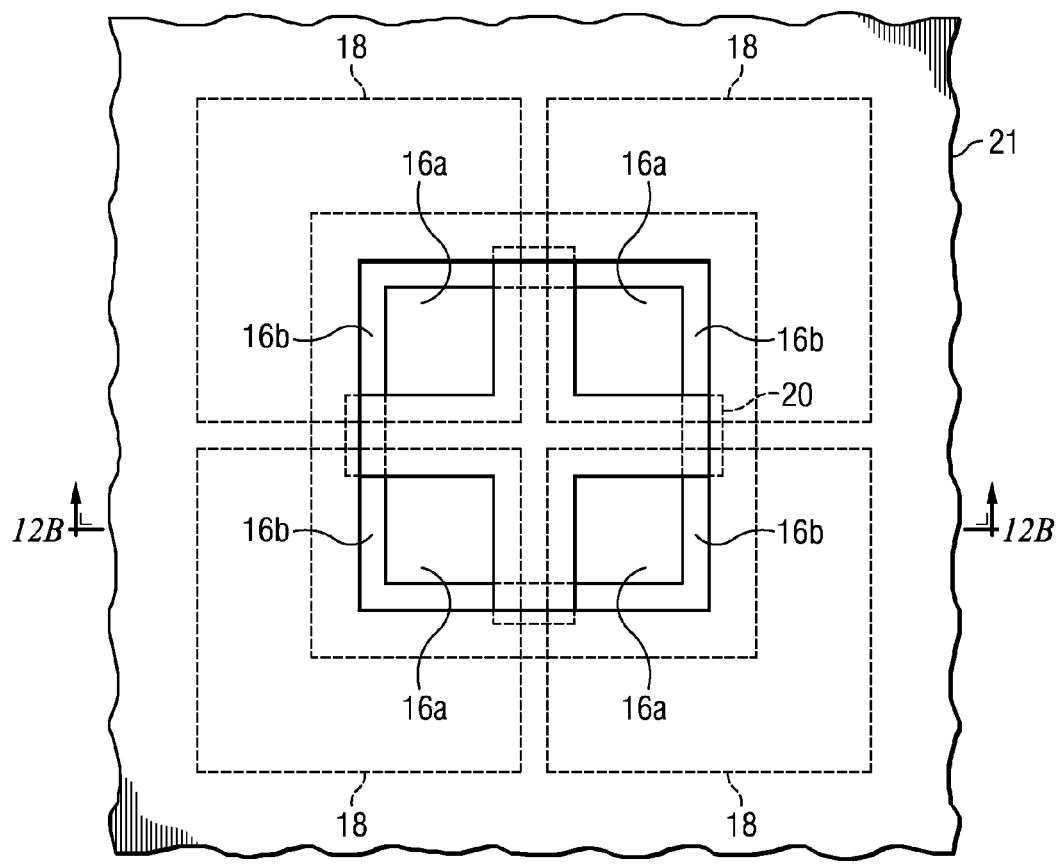
FIG. 13(A) is a plan view illustrating the manufacturing process of the semiconductor device disclosed in the second embodiment of the present invention.
Figure 13B:
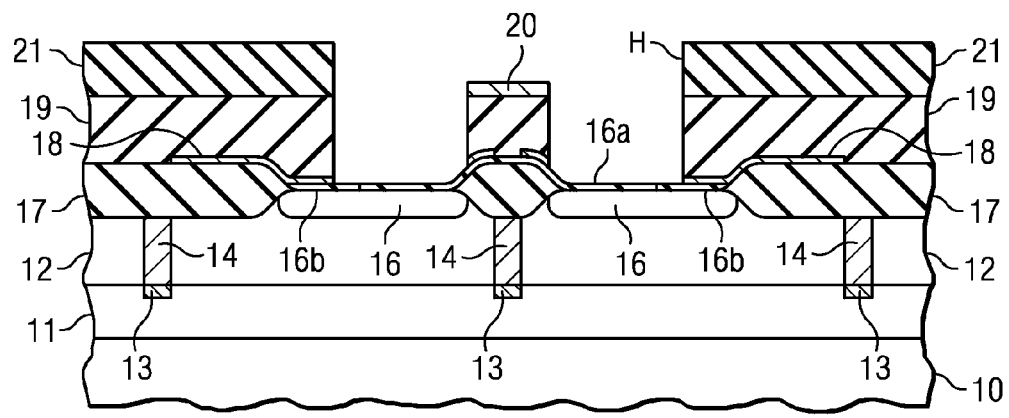
FIG. 13(B) is the cross-sectional view as shown in FIG. 13(A).

Then, as shown in FIG. 13(A) and FIG. 13(B), after resist film R2 is removed, wet etching is performed as the second etching, with the first insulation film 19 and the second insulation film 20 used as etching stopper to remove conductive layer 18. In this case, the etching solution used is such that mask layer 20 remains.

As a result of the aforementioned etching, an opening part, which exposes silicon nitride layer 16a and silicide layer 16b on $n^+$ semiconductor region 16, is formed with respect to each conductive layer 18. Each conductive layer 18 partially remains on the element-separating region between the adjacent PIN photodiodes, which is the region superposed with mask layer 20. However, since [the conductive layer] is separated for PIN photodiodes when it is formed as described above, short circuits will not occur. It is also possible to perform over-etching during the second etching to completely remove the conductive layer 18 on the element-separating region between the PIN photodiodes.

After that, an insulation film made of silicon nitride, etc., is deposited on the entire surface by means of CVD to form surface protective layer 22. In this way, the semiconductor device disclosed in this embodiment shown in FIGS. 8(A) and 8(B) can be manufactured.

For the semiconductor device disclosed in the aforementioned embodiment, even if the opening part is formed in the insulation film in order to improve the sensitivity as described in this manufacturing method, since the conductive layer and the mask layer are used as etching stopper, leakage-causing damage can be prevented. Since the conductive layer connected to the second semiconductor layer that constitutes each photodiode is formed in a pattern divided for each photodiode, the photodiodes can be constituted so as to not short circuit.

In the aforementioned embodiment, such an etching solution is used that mask layer 20 is not removed during the second etching. However, it is also possible to remove the mask layer at the same time.

Third Embodiment

Figure 14A:
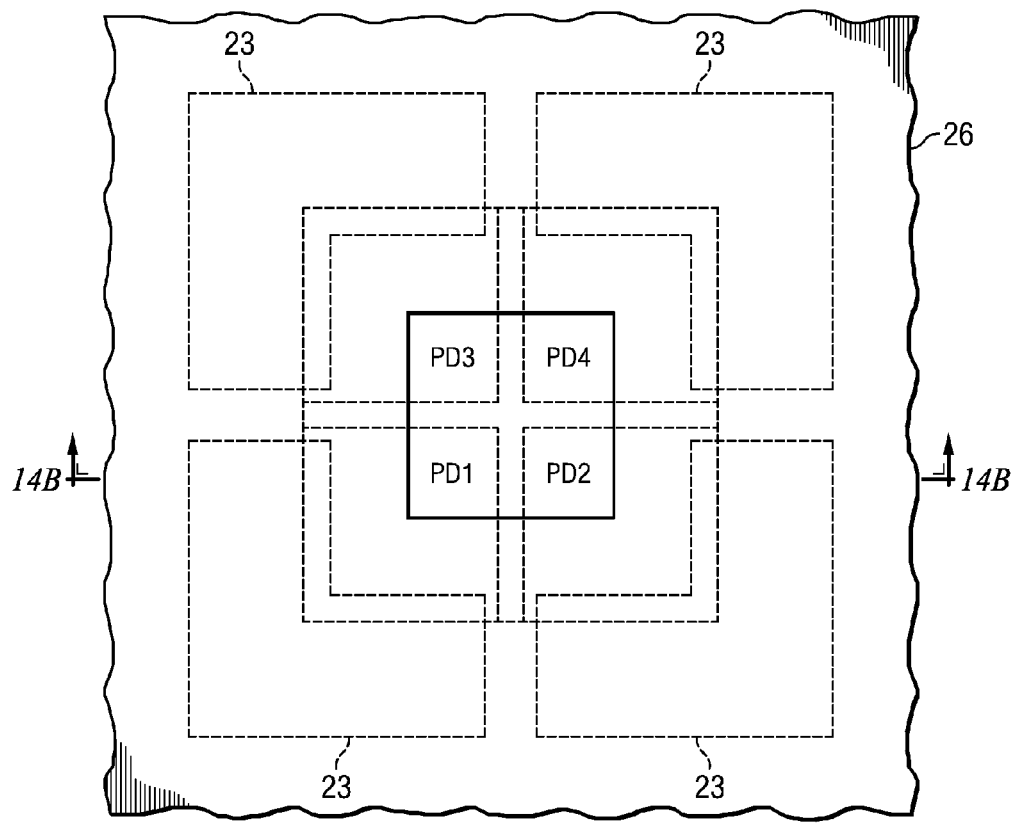
FIG. 14(A) is the plan view of the semiconductor device disclosed in the third embodiment of the present invention.
Figure 14B:
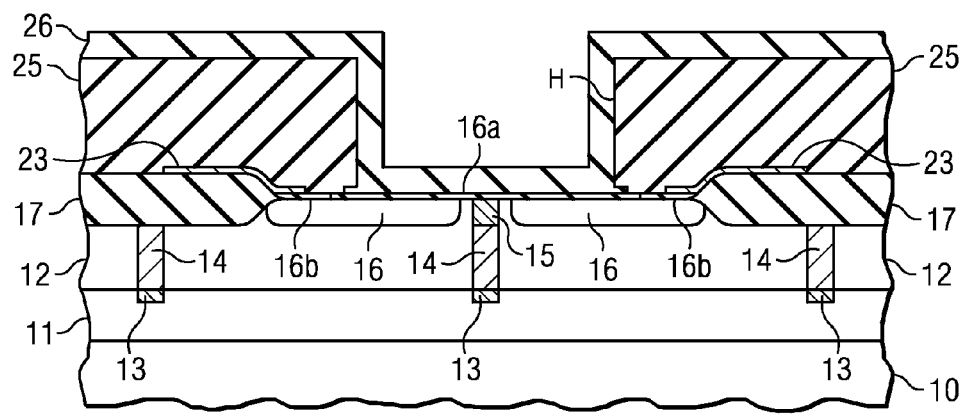
FIG. 14(B) is the cross-sectional view as shown in FIG. 14(A).

The semiconductor device disclosed in this embodiment has four photodiodes formed adjacent to each other via element-separating regions in the same way as described in the first embodiment. Its configuration is shown in the plan view of FIG. 14(A) and FIG. 14(B).

Four PIN photodiodes (PD1-PD4) are formed in the same way as described in the first embodiment.

The second semiconductor layer of the second conductivity type (n type epitaxial layer 12 and $n^+$-type semiconductor region 16) is formed on the main surface of the first semiconductor layer of the first conductivity type ($p^{++}$-type silicon semiconductor substrate 10 and $p^-$ type epitaxial layer 11). Silicon nitride layer 16a is formed on the surface at the central part of $n^+$-type semiconductor region 16. Silicide layer 16b made of platinum silicide, etc., is formed on the surface near the edge of $n^+$-type semiconductor region 16a, which is the outer periphery of silicon nitride layer 16. The device is separated by element-separating regions comprised of $p^{++}$-type semiconductor regions (13, 14, 15) and LOCOS element-separating insulation film 17. In this way, four approximately square PIN photodiodes (PD1-PD4) are formed adjacent to each other. The outer periphery of the entire device has an approximately square shape.

Each PIN photodiode (PD1-PD4) side is, for example, approximately several μm to tens of μm. Each side of the approximately square device comprised of the four integrated photodiodes is, for example, about 40 μm. Also, the intervals between the PIN photodiodes are reduced to about 5 μm or less.

Conductive layer 23 made of Al/TiW or other metal is formed via silicide layer 16b on $n^+$-type semiconductor region 16 in a pattern, which is connected to $n^+$-type semiconductor region 16 that forms the second semiconductor layer via silicide layer 16b along the outer periphery with respect to all four of said PIN photodiodes (PD1-PD4), and which is divided for each of PIN photodiodes (PD1-PD4).

In other words, each of PIN photodiodes (PD1-PD4) has an approximately square shape, and conductive layer 23 is formed in a pattern connected to $n^+$-type semiconductor region 16 via silicide layer 16b on the two sides of each square.

An insulation layer 25 made of silicon oxide, etc., is formed on the entire surface to cover conductive layer 23.

An opening part H, which reaches silicon nitride layer 16a and suicide layer 16b on $n^+$-type semiconductor region 16 that forms the second semiconductor layer, is formed in insulation layer 25 in the region inside the pattern of conductive layer 23.

Also, a surface protective layer 26 is formed to cover the area inside the opening part H.

For the four PIN photodiodes (PD1-PD4) with the aforementioned configuration, since conductive layer 23 is connected to $n^+$-type semiconductor region 16 via silicide layer 16b, a voltage can be applied to $n^+$-type semiconductor region 16 via conductive layer 23.

In the following, the method of manufacturing the semiconductor device disclosed in the aforementioned embodiment will be explained.

Figure 15A:
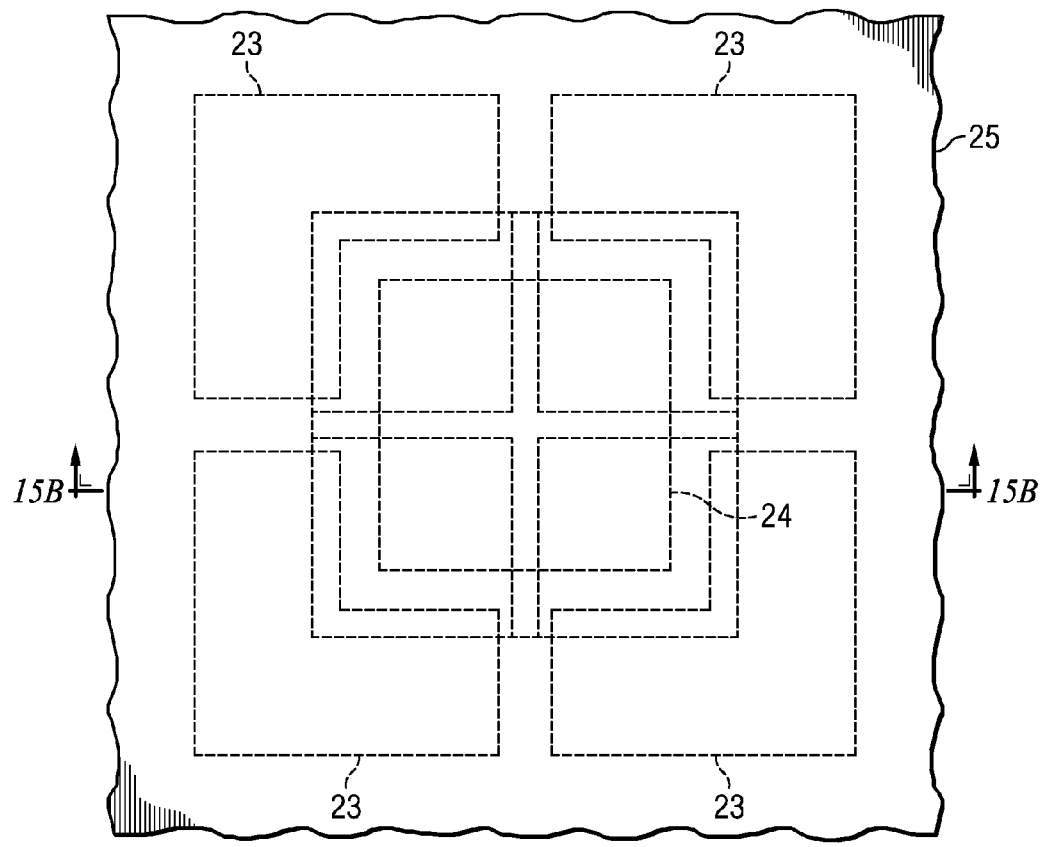
FIG. 15(A) is a plan view illustrating the manufacturing process of the semiconductor device disclosed in the third embodiment of the present invention.
Figure 15B:
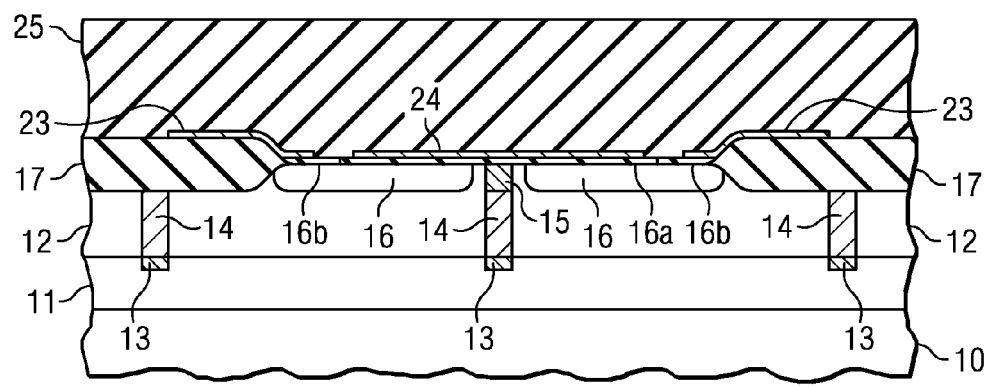
FIG. 15(B) is the cross-sectional view as shown in FIG. 15(A).

First, as shown in FIG. 15(A) and FIG. 15(B), four approximately square-shaped PIN photodiodes (PD1-PD4) are formed adjacent to each other in the same way as described in the first embodiment.

Then, a metal layer made of Al/TiW, etc., is deposited by means of sputtering in a thickness of about 200-300 nm on the entire surface to cover silicon nitride layer 16a and silicide layer 16b on $n^+$-type semiconductor region 16, followed by patterning to form conductive layer 23, which is divided for each of PIN photodiodes (PD1-PD4) and is connected to $n^+$-type semiconductor region 16 that forms the second semiconductor layer via suicide layer 16b along the outer periphery with respect to all four of the aforementioned PIN photodiodes (PD1-PD4).

At the same time of patterning said conductive layer 23, a mask layer 24 is formed in the region inside conductive layer 23 on $n^+$-type semiconductor region 16 that forms the second semiconductor layer via silicon nitride layer 16a by patterning the same metal layer made of Al/TiW, etc., used for conductive layer 23.

Then, insulation film 25 is formed on the entire surface to cover conductive layer 23 and mask layer 24. The first insulation film 25 is formed as a single layer or as plural laminated layers by depositing silicon oxide by CVD with TEOS used as the raw material, or by depositing a BPSG film, or by depositing silicon nitride by CVD.

Figure 16A:
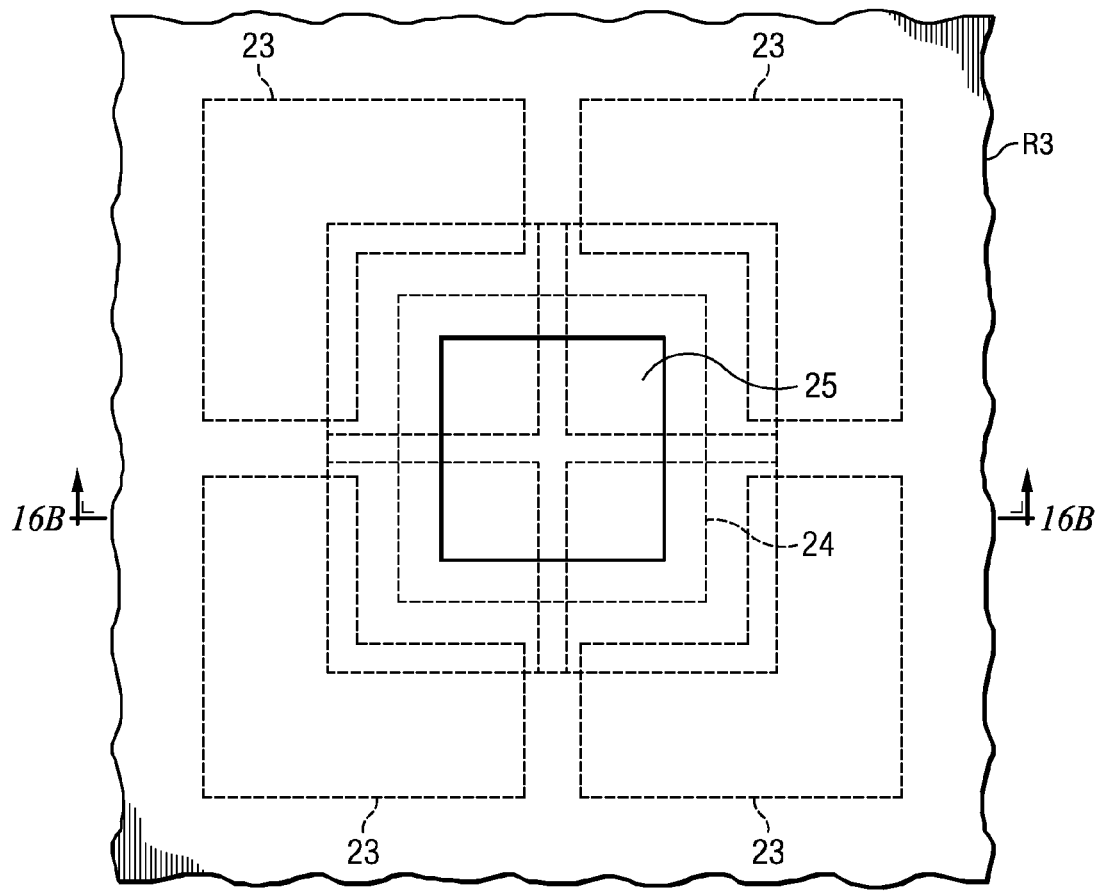
FIG. 16(A) is a plan view illustrating the manufacturing process of the semiconductor device disclosed in the third embodiment of the present invention.
Figure 16B:
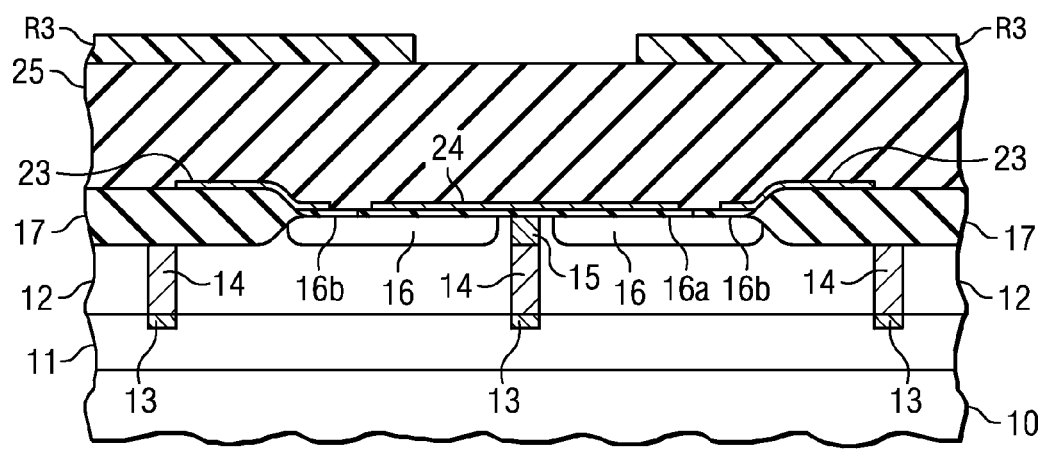
FIG. 16(B) is the cross-sectional view as shown in FIG. 16(A).

Then, as shown in FIG. 16(A) and FIG. 16(B), a resist film R3 is formed in a pattern that opens only in the region of mask layer 24.

Figure 17A:
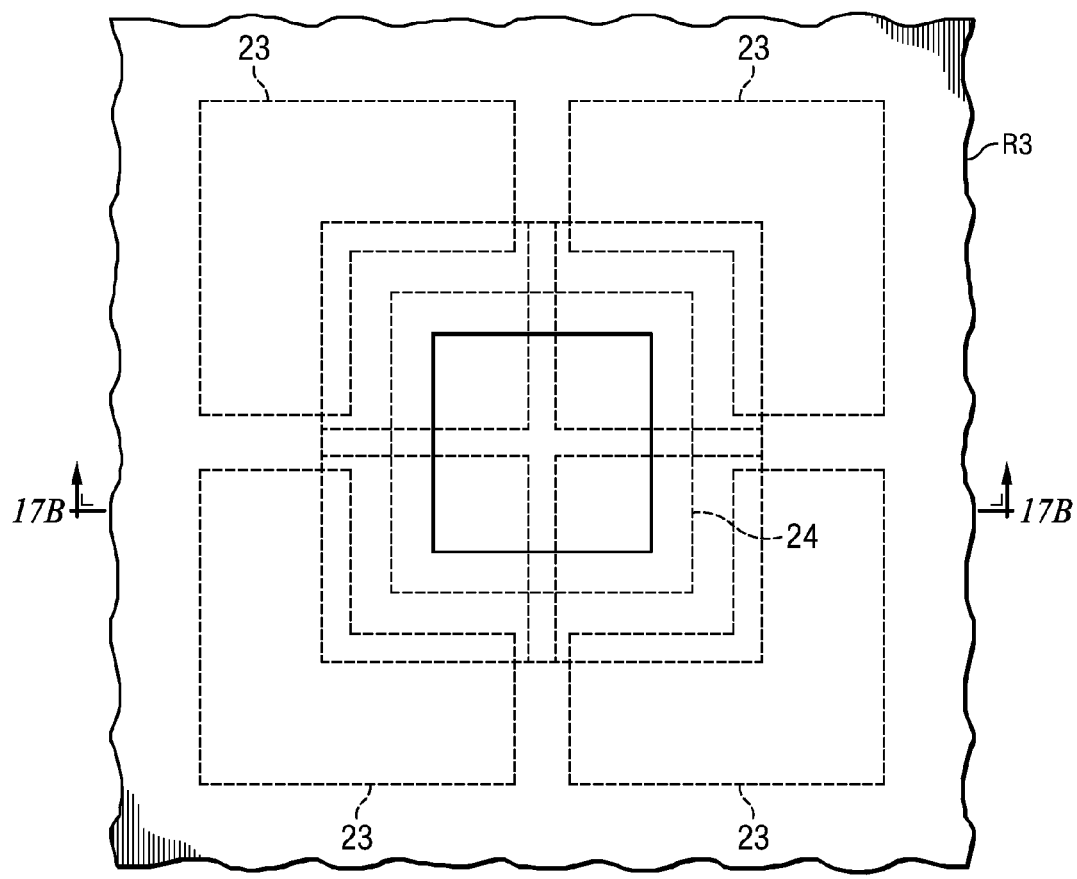
FIG. 17(A) is a plan view illustrating the manufacturing process of the semiconductor device disclosed in the third embodiment of the present invention.
Figure 17B:
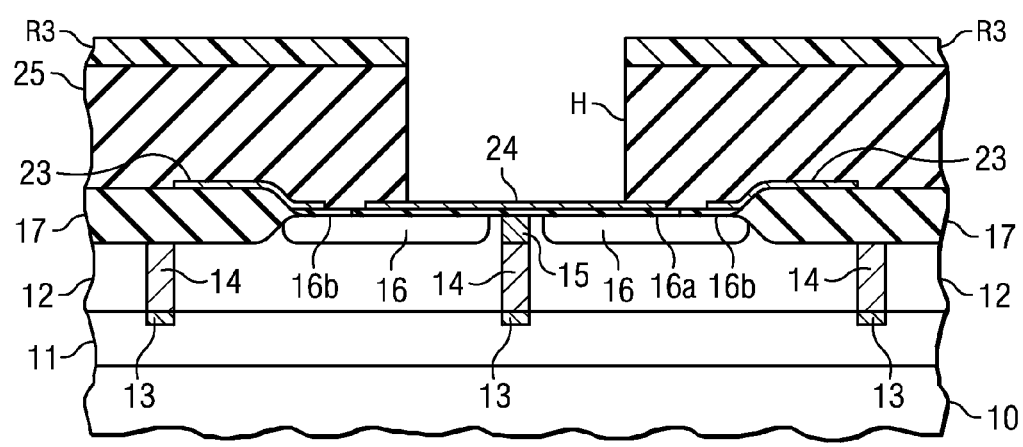
FIG. 17(B) is the cross-sectional view as shown in FIG. 17(A).

Then, as shown in FIG. 17(A) and FIG. 17(B), dry etching, such as reactive ion etching, is performed as the first etching with mask layer 24 used as etching stopper to form opening part H, which exposes mask layer 24, in insulation layer 25.

Figure 18A:
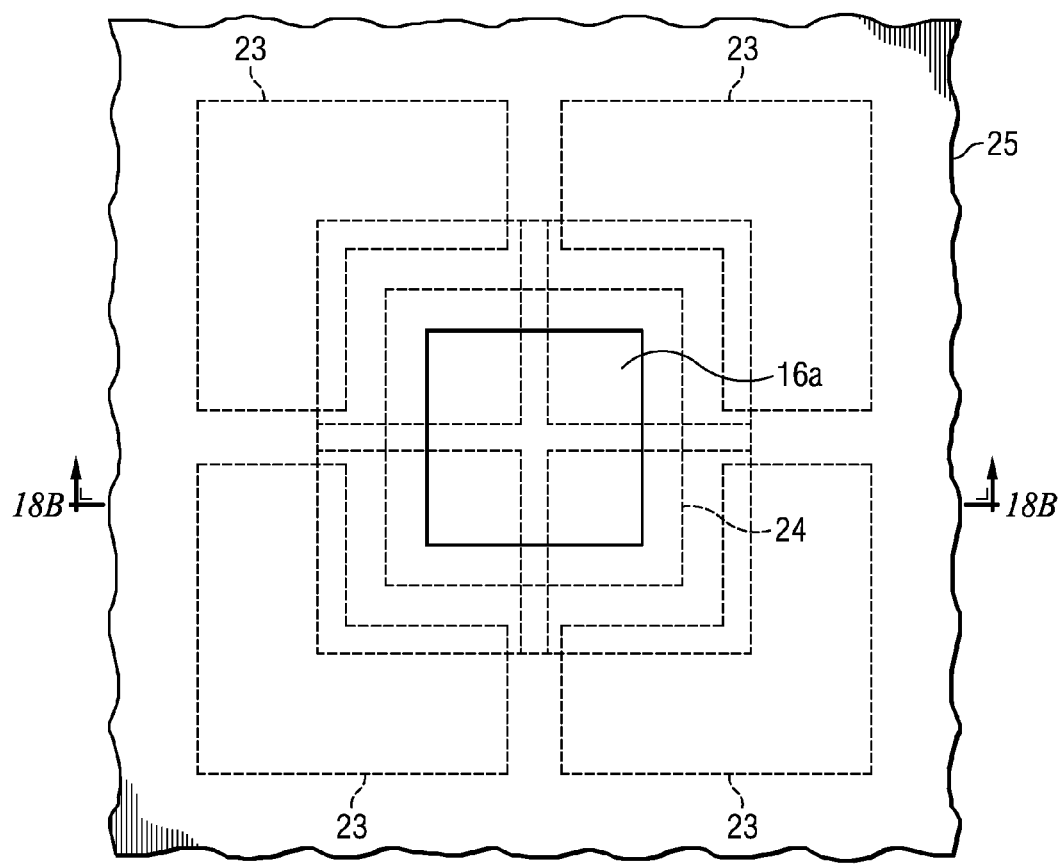
FIG. 18(A) is a plan view illustrating the manufacturing process of the semiconductor device disclosed in the third embodiment of the present invention.
Figure 18B:
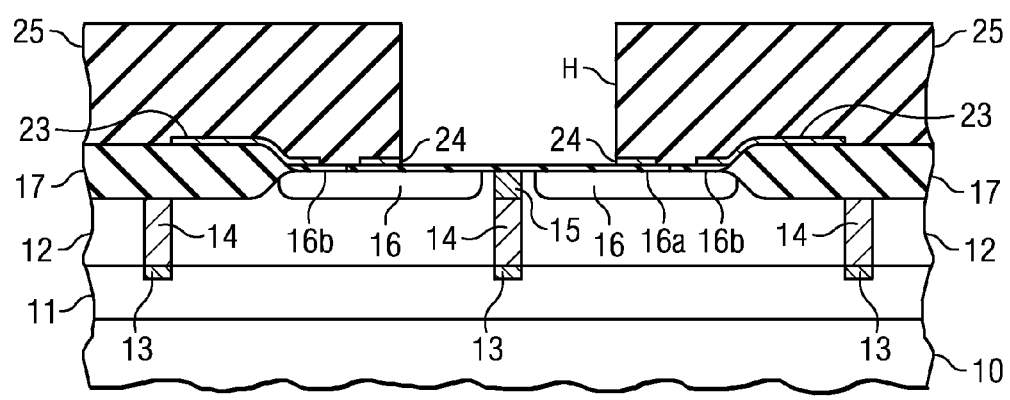
FIG. 18(B) is the cross-sectional view as shown in FIG. 18(A).

Then, as shown in FIG. 18(A) and FIG. 18(B), after resist film R3 is removed, wet etching is perform as the second etching with insulation film 25 used as etching mask to remove mask layer 24.

As a result of the aforementioned etching, mask layer 24 is left in a pattern, which is connected via silicon nitride layer 16a to $n^+$-type semiconductor region 16 of the four PIN photodiodes (PD1-PD4) in the region superposed with resist film R3.

Figure 19A:
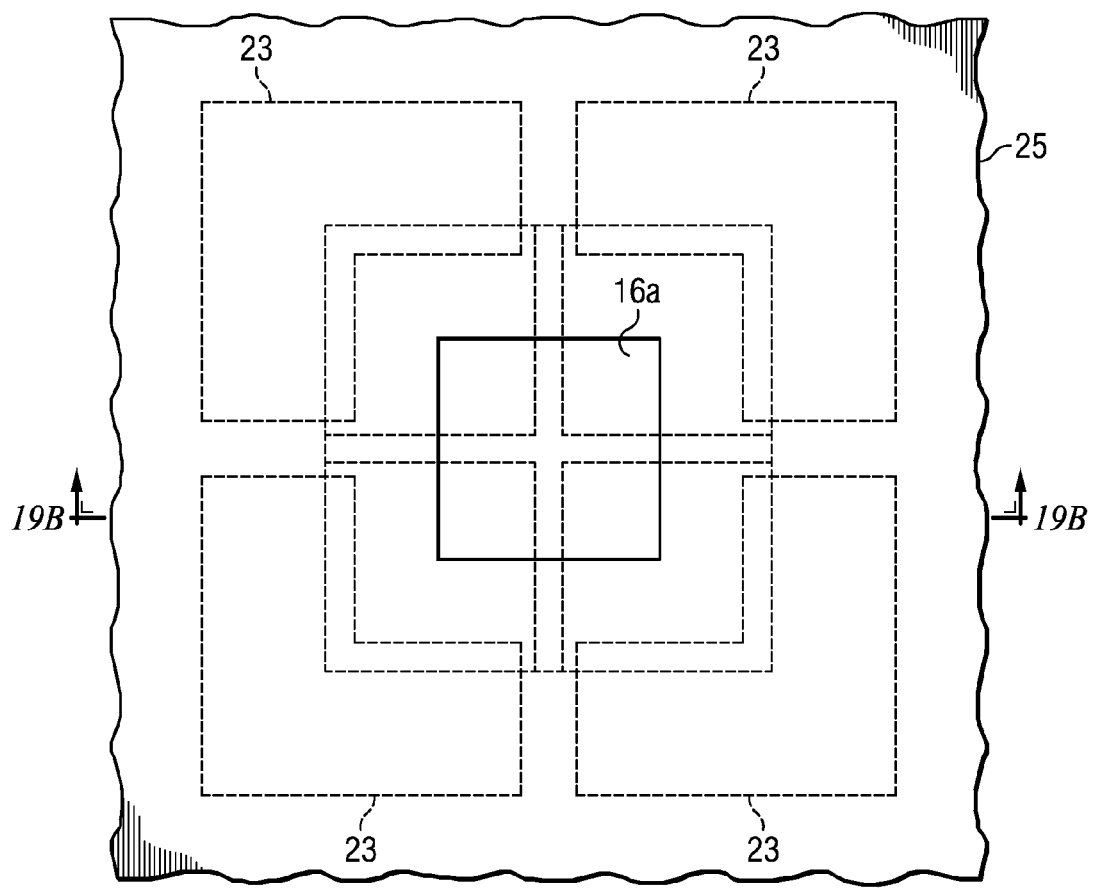
FIG. 19(A) is a plan view illustrating the manufacturing process of the semiconductor device disclosed in the third embodiment of the present invention.
Figure 19B:
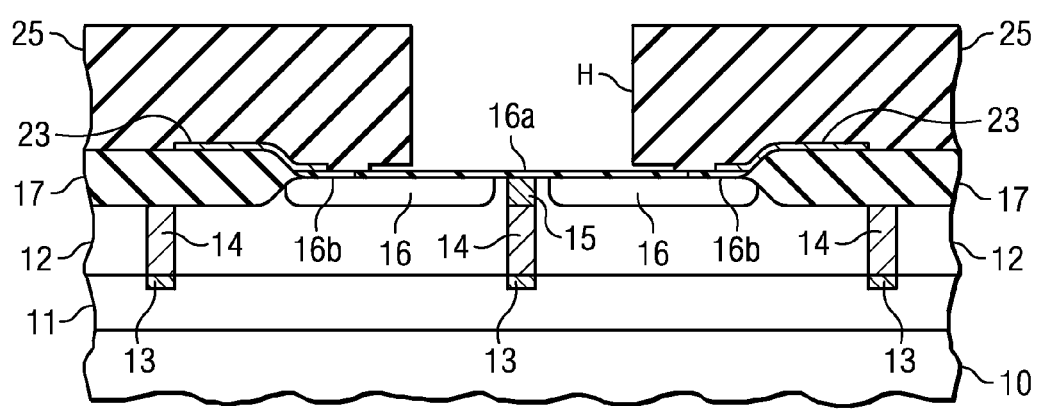
FIG. 19(B) is the cross-sectional view as shown in FIG. 19(A).

Then, as shown in FIG. 19(A) and FIG. 19(B), over-etching is performed during the second etching to also carry out etching in the horizontal direction to remove mask layer 24. Because of the presence of silicon nitride layer 16a, there is no need to worry about short circuits even if mask layer 24 partially remains, as long as it is on the silicon nitride layer.

After that, an insulation film made of silicon nitride is deposited by CVD to form surface protective layer 26. In this way, the semiconductor device disclosed in this embodiment shown in FIG. 14(A) and FIG. 14(B) can be manufactured.

For the semiconductor device disclosed in the aforementioned embodiment, even if the opening part is formed in the insulation film in order to improve the sensitivity as described in this manufacturing method, since the conductive layer and the mask layer are used as etching stopper, leakage-causing damage can be prevented. Since the conductive layer connected to the second semiconductor layer that constitutes each photodiode is formed in a pattern divided for each photodiode, the photodiodes can be constituted so as to not short circuit.

In this embodiment, the four PIN photodiodes are separated from each other by the $p^{++}$-type semiconductor region. However, it is also possible to use the LOCOS element-separating insulation film in the same way as described in the second embodiment.

Fourth Embodiment

Figure 20A:
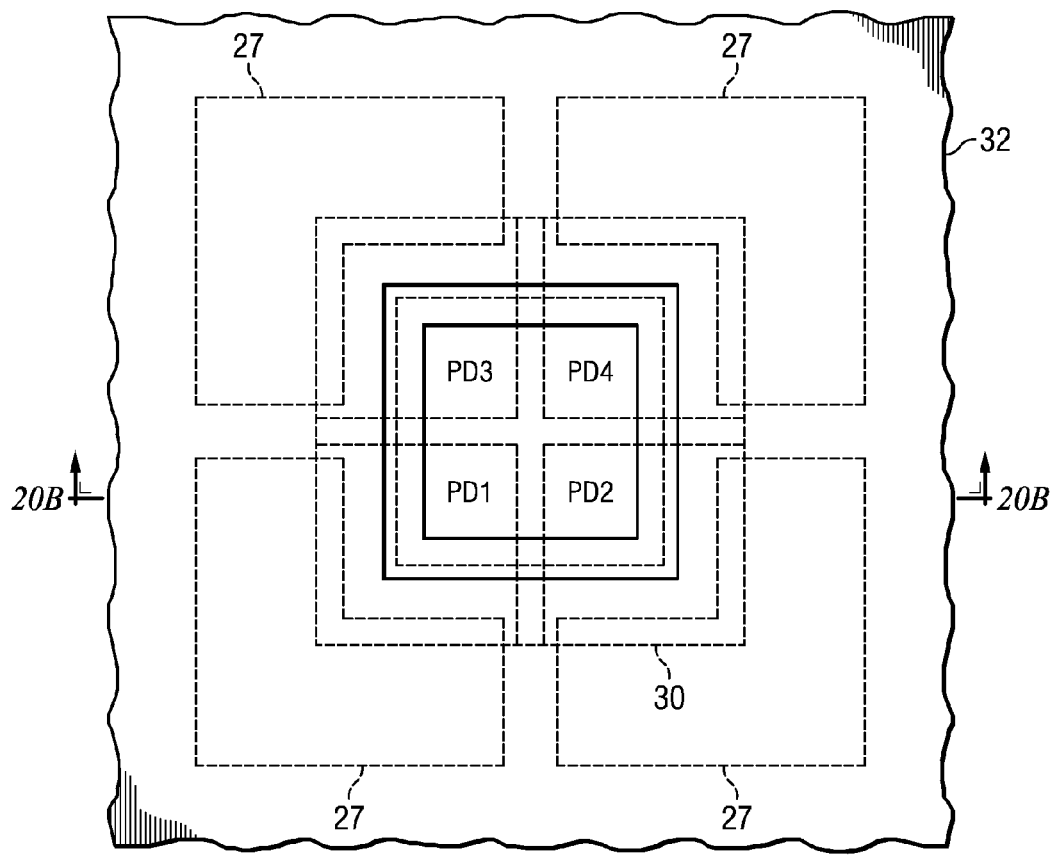
FIG. 20(A) is a plan view of the semiconductor device disclosed in the fourth embodiment of the present invention.
Figure 20B:
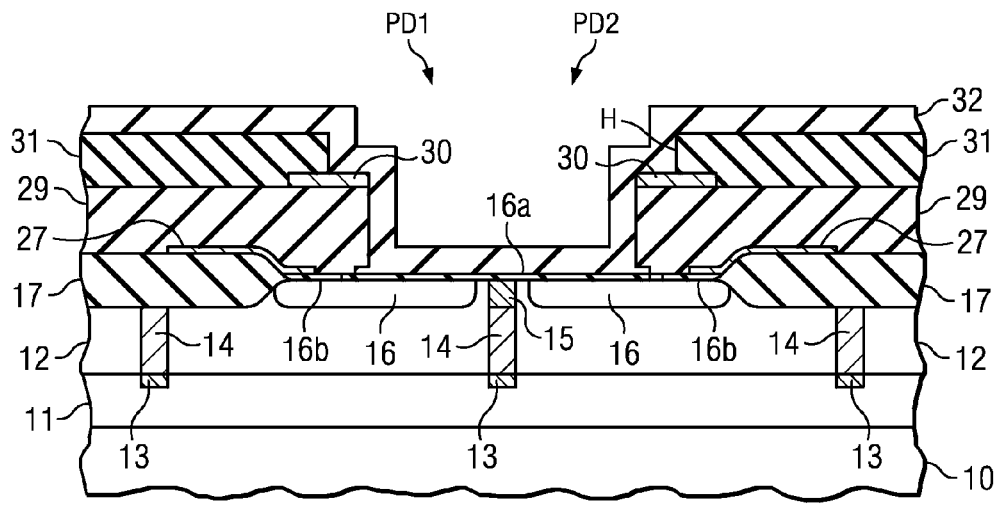
FIG. 20(B) is the cross-sectional view as shown in FIG. 20(A).

The semiconductor device disclosed in this embodiment has four photodiodes formed adjacent to each other via element-separating regions in the same way as described in the first embodiment. Its configuration is shown in FIG. 20(A) and FIG. 20(B).

Four PIN photodiodes (PD1-PD4) are formed in the same way as described in the first embodiment.

The second semiconductor layer of the second conductivity type (n type epitaxial layer 12 and $n^+$-type semiconductor region 16) is formed on the main surface of the first semiconductor layer of the first conductivity type ($p^{++}$-type silicon semiconductor substrate 10 and $p^-$ type epitaxial layer 11). Silicon nitride layer 16a is formed on the surface at the central part of $n^+$-type semiconductor region 16. Silicide layer 16b made of platinum silicide, etc., is formed on the surface near the edge of $n^+$-type semiconductor region 16a, which is the outer periphery of silicon nitride layer 16. The device is separated by element-separating regions comprised of $p^{++}$-type semiconductor regions (13, 14, 15) and LOCOS element-separating insulation film 17. In this way, four approximately square PIN photodiodes (PD1-PD4) are formed adjacent to each other. The outer periphery of the entire device has an approximately square shape.

Each PIN photodiode (PD1-PD4) side is, for example, approximately several μm to tens of μm. Each side of the approximately square device comprised of the four integrated photodiodes is, for example, about 40 μm. Also, the intervals between the PIN photodiodes are reduced to about 5 μm or less.

Conductive layer 27 made of Al/TiW or other metal is formed via silicide layer 16b on $n^+$-type semiconductor region 16 in a pattern, which is connected to $n^+$-type semiconductor region 16 that forms the second semiconductor layer via silicide layer 16b along the outer periphery with respect to all of said four PIN photodiodes (PD1-PD4), and which is divided for each of PIN photodiodes (PD1-PD4).

In other words, each of PIN photodiodes (PD1-PD4) has an approximately square shape, and conductive layer 27 is formed in a pattern connected to $n^+$-type semiconductor region 16 via silicide layer 16b on the two sides of each square.

It is also possible to directly connect conductive layer 27 to $n^+$-type semiconductor region 16 via contact without forming silicide layer 16b.

The first insulation film 29 made of silicon oxide, etc., is formed on the entire surface to cover conductive layer 27, followed by forming the second insulation layer 31 on the first insulation layer 29.

An opening part H that reaches silicon nitride layer 16a on $n^+$-type semiconductor region 16 that forms the second semiconductor layer is formed in the first insulation layer 29 and the second insulation layer 31 in the region inside the pattern of conductive layer 27.

A ring-shaped (second) mask layer 30 made of TiN/Al/TiN, for example, is formed along the outer periphery of opening part H.

Also, a surface protective layer 22 is formed to cover the opening part H.

For the four PIN photodiodes (PD1-PD4) with the aforementioned configuration, since conductive layer 23 is connected to $n^+$-type semiconductor region 16 via silicide layer 16b, a voltage can be applied to $n^+$-type semiconductor region 16 via conductive layer 23.

In the following, the method of manufacturing the semiconductor device disclosed in the aforementioned embodiment will be explained.

Figure 21A:
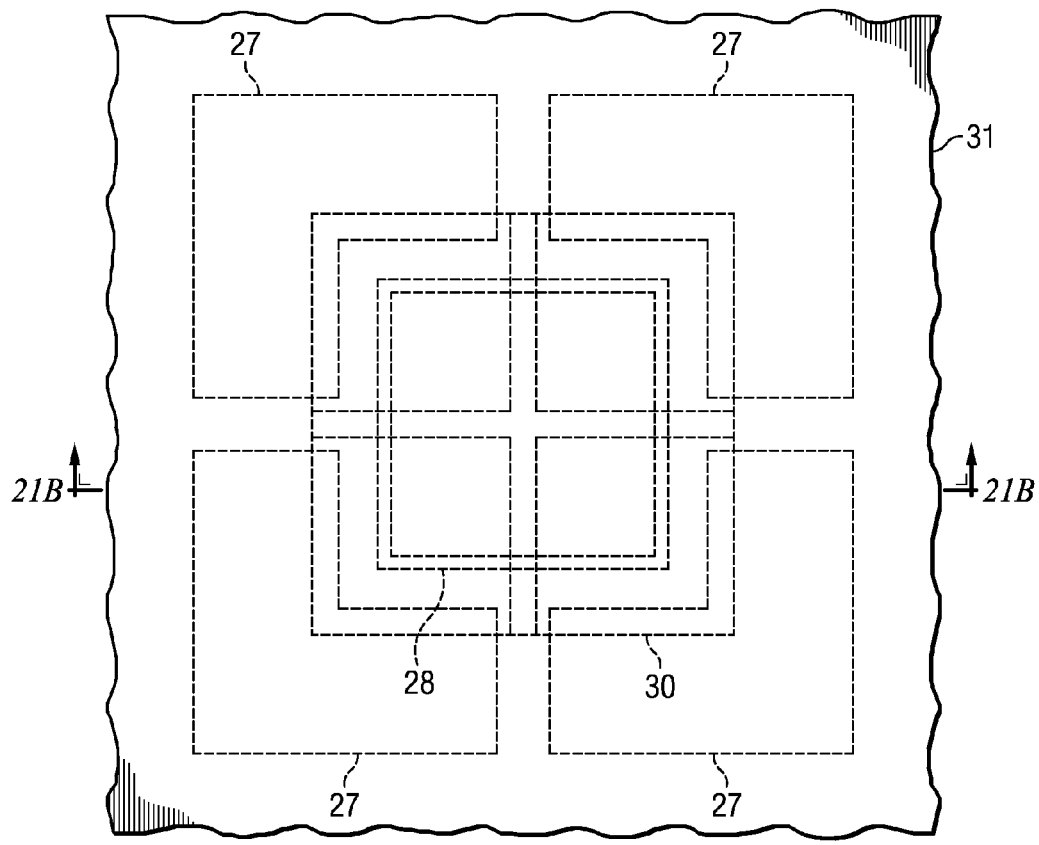
FIG. 21(A) is a plan view illustrating the manufacturing process of the semiconductor device disclosed in the fourth embodiment of the present invention.
Figure 21B:
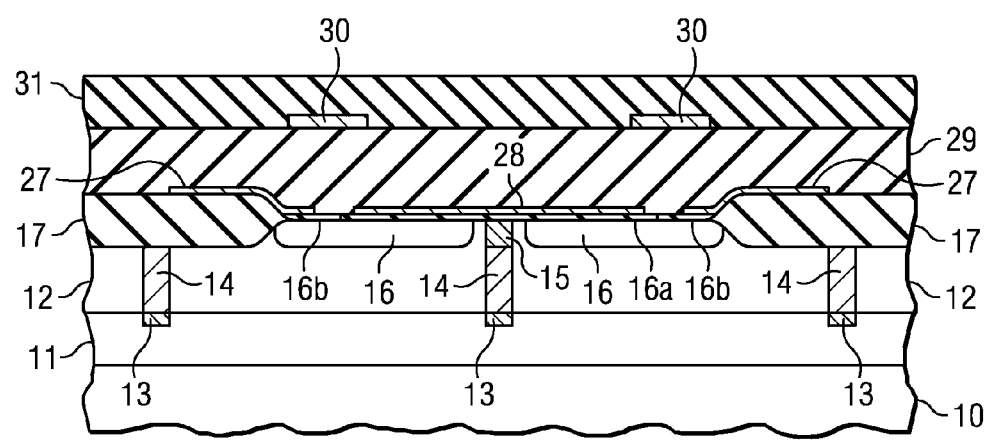
FIG. 21(B) is the cross-sectional view as shown in FIG. 21(A).

First, as shown in FIG. 21(A) and FIG. 21(B), four approximately square-shaped PIN photodiodes (PD1-PD4) are formed adjacent to each other in the same way as described in the first embodiment.

Then, a metal layer made of Al/TiW, etc., is deposited by means of sputtering in a thickness of about 200-300 nm on the entire surface to cover silicon nitride layer 16a and silicide layer 16b on $n^+$-type semiconductor region 16, followed by patterning to form conductive layer 27, which is divided for each of PIN photodiodes (PD1-PD4) and is connected to $n^+$-type semiconductor region 16 that forms the second semiconductor layer via silicide layer 16b along the outer periphery with respect to all of the aforementioned four PIN photodiodes (PD1-PD4). It is also possible to form conductive layer 27 directly on $n^+$-type semiconductor region 16 without forming silicide layer 16b.

At the same time of patterning said conductive layer 27, a first mask layer 28 is formed in the region inside conductive layer 27 on $n^+$-type semiconductor region 16 that forms the second semiconductor layer via silicon nitride layer 16a by patterning the same metal layer made of Al/TiW, etc., used for conductive layer 27.

Then, the first insulation film 29 is formed on the entire surface to cover conductive layer 27 and the first mask layer 28. The first insulation film 29 is formed as a single layer or as plural laminated layers by depositing silicon oxide by CVD with TEOS used as the raw material, or by depositing a BPSG film, or by depositing silicon nitride by CVD.

Then, TiN/Al/TiN, etc., is deposited in a thickness of about 200-300 nm on the first insulation film 19 by means of sputtering, followed by patterning for the second mask layer 30 having a region superposed with the outer periphery of the first mask layer 28.

Then, like the first insulation film 29, the second insulation film 31 is formed on the entire surface to cover the second mask layer 30.

Figure 22A:
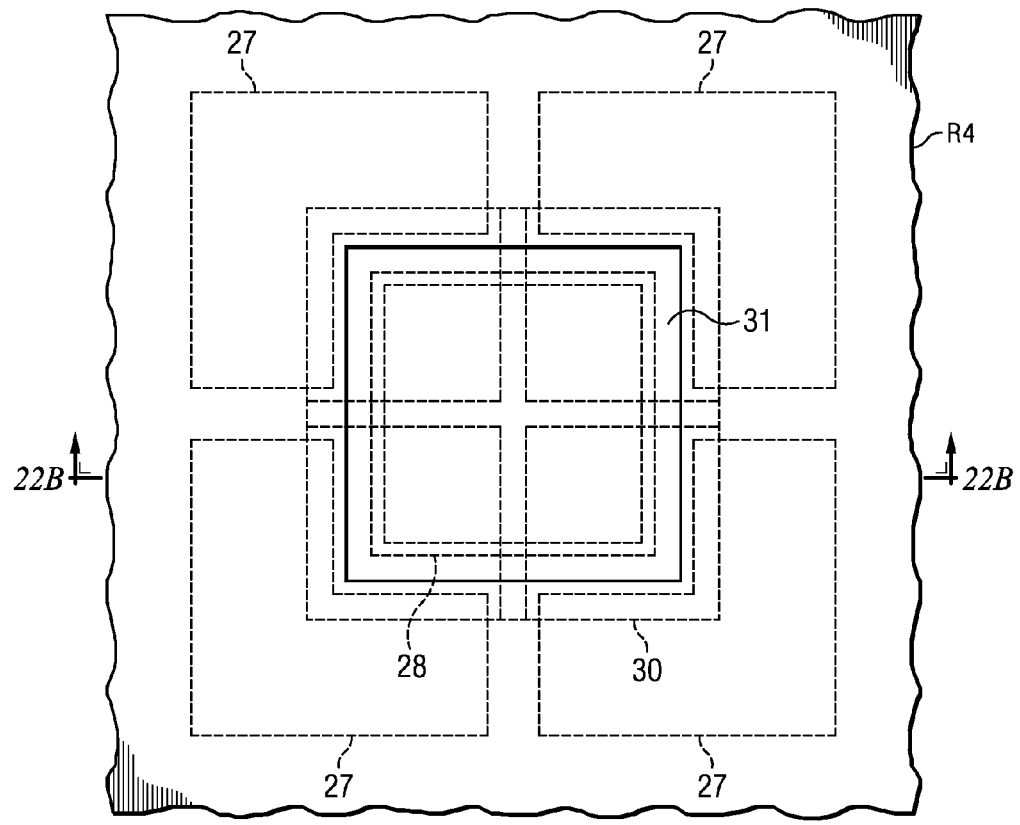
FIG. 22(A) is a plan view illustrating the manufacturing process of the semiconductor device disclosed in the fourth embodiment of the present invention.
Figure 22B:
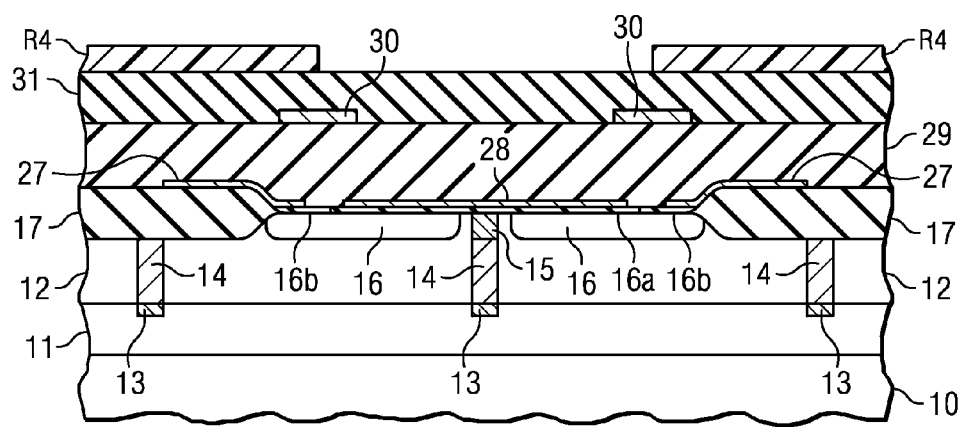
FIG. 22(B) is the cross-sectional view as shown in FIG. 22(A).

Then, as shown FIG. 22(A) and FIG. 22(B), a resist film R4 is formed in such a pattern that the first mask layer 28 and/or the second mask layer 30 is present at any position in the open region.

Figure 23A:
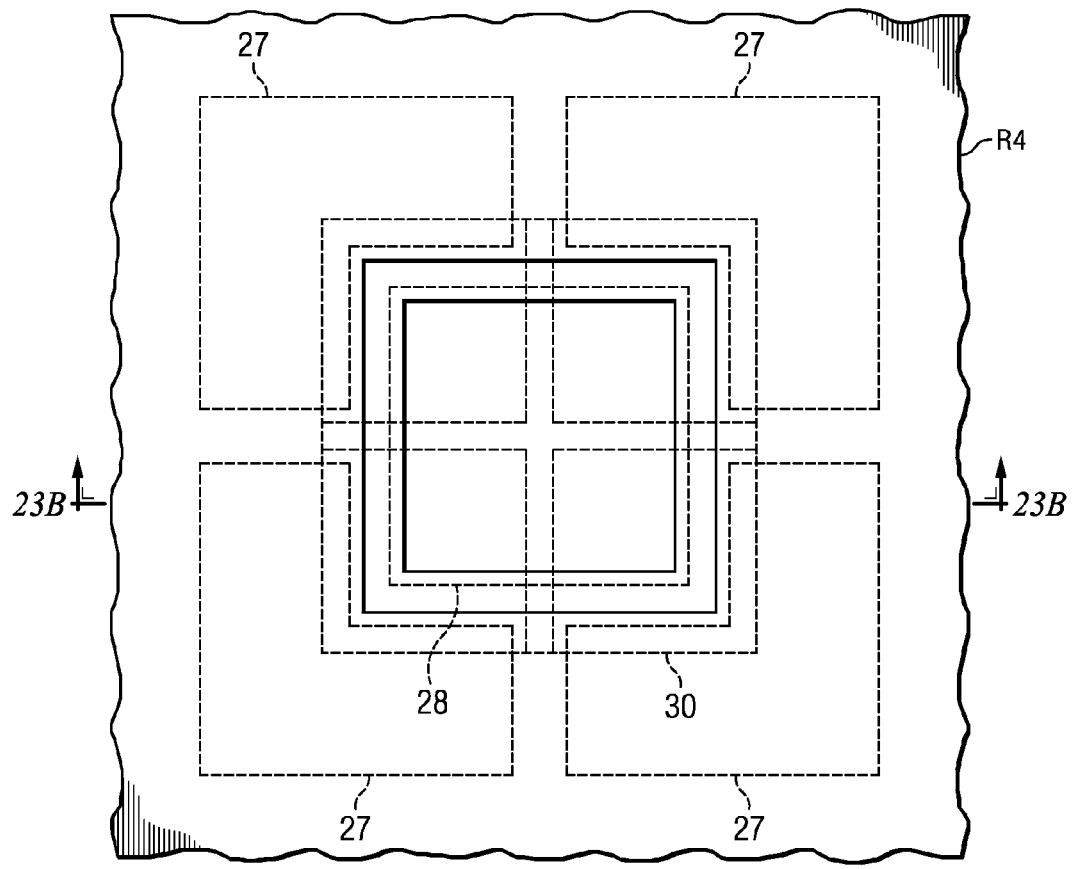
FIG. 23(A) is a plan view illustrating the manufacturing process of the semiconductor device disclosed in the fourth embodiment of the present invention.
Figure 23B:
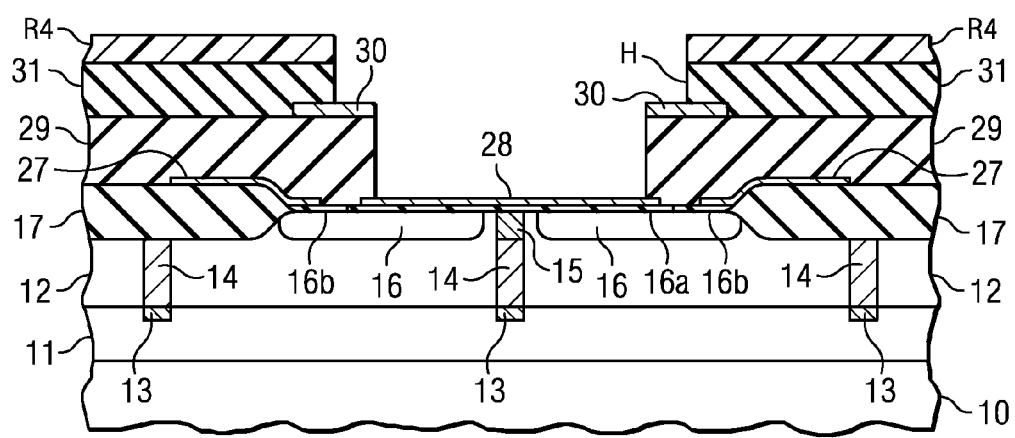
FIG. 23(B) is the cross-sectional view as shown in FIG. 23(A).

Then, as shown in FIG. 23(A) and FIG. 23(B), with the first mask layer 28 and the second mask layer 30 used as etching stopper, dry etching, such as reactive ion etching, is performed as the first etching to form opening part H, which exposes the first mask layer 28 and the second mask layer 30, in the first insulation layer 29 and the second insulation layer 31.

In this case, when the second mask layer 30 is absent, if the first and second insulation layers are thick, it may be difficult to keep the opening formed with resist film R4 used as mask within the range of the first mask layer 28. In this embodiment, however, there is a region superposed with the second mask layer 30 on the outer periphery of the first mask layer 28. Since the second mask layer is closer to resist film R4 than the first mask layer, it is possible to control the opening from going beyond the first and second mask layers.

Figure 24A:
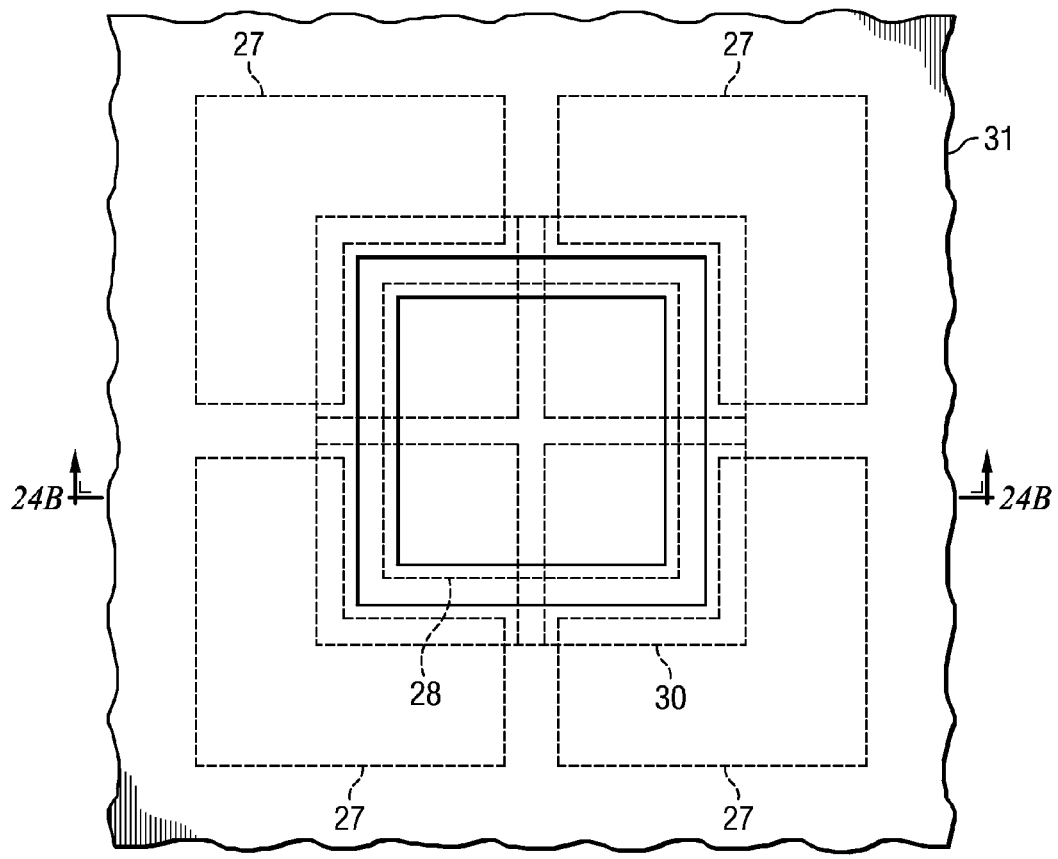
FIG. 24(A) is a plan view illustrating the manufacturing process of the semiconductor device disclosed in the fourth embodiment of the present invention.
Figure 24B:
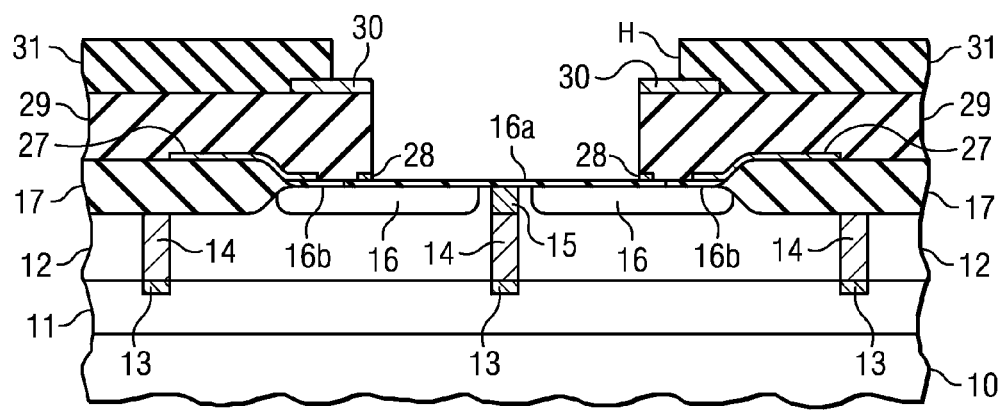
FIG. 24(B) is the cross-sectional view as shown in FIG. 24(A).

Then, as shown in FIG. 24(A) and FIG. 24(B), after resist film R4 is removed, wet etching is performed as the second etching with the first insulation film 29 and the second insulation film 30 used as the etching mask to remove the first mask layer 28. In this case, such an etching solution is used that the second mask layer 30 remains.

As a result of the aforementioned etching, the first mask layer 28 remains in a pattern on the silicon nitride layer 16a on $n^+$-type semiconductor region 16 of the four PIN photodiodes (PD1-PD4) in the region superposed with the second mask layer 30.

Figure 25A:
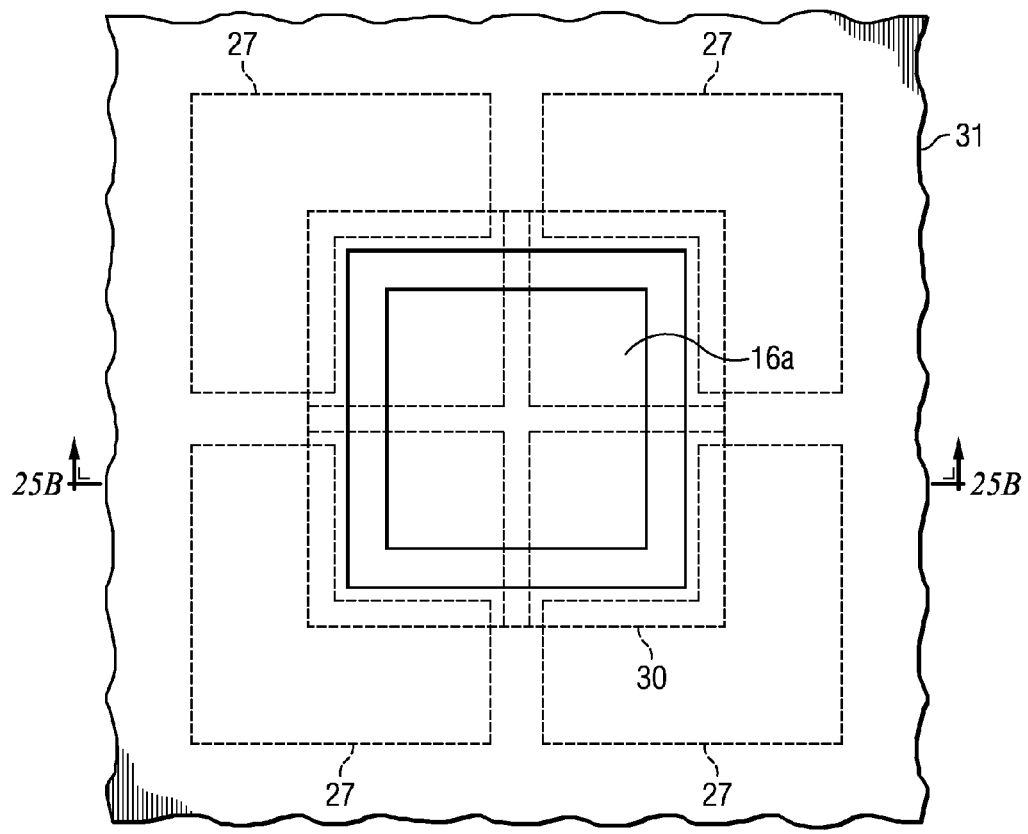
FIG. 25(A) is a plan view illustrating the manufacturing process of the semiconductor device disclosed in the fourth embodiment of the present invention.
Figure 25B:
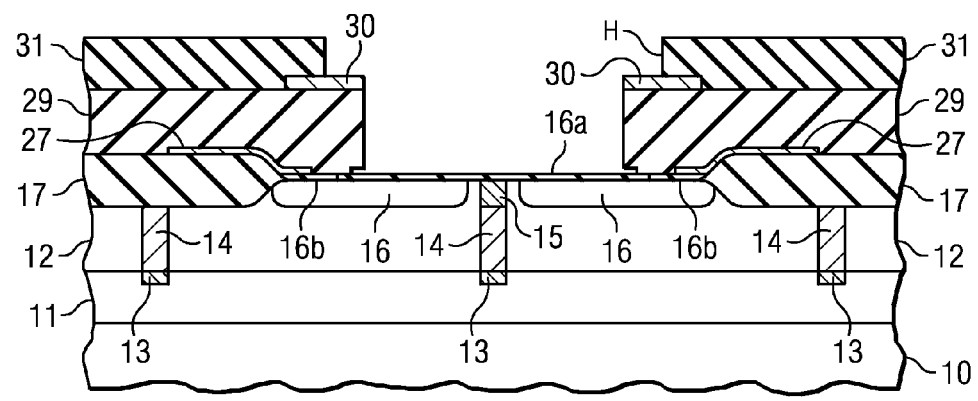
FIG. 25(B) is the cross-sectional view as shown in FIG. 25(A).
Figure 26A:
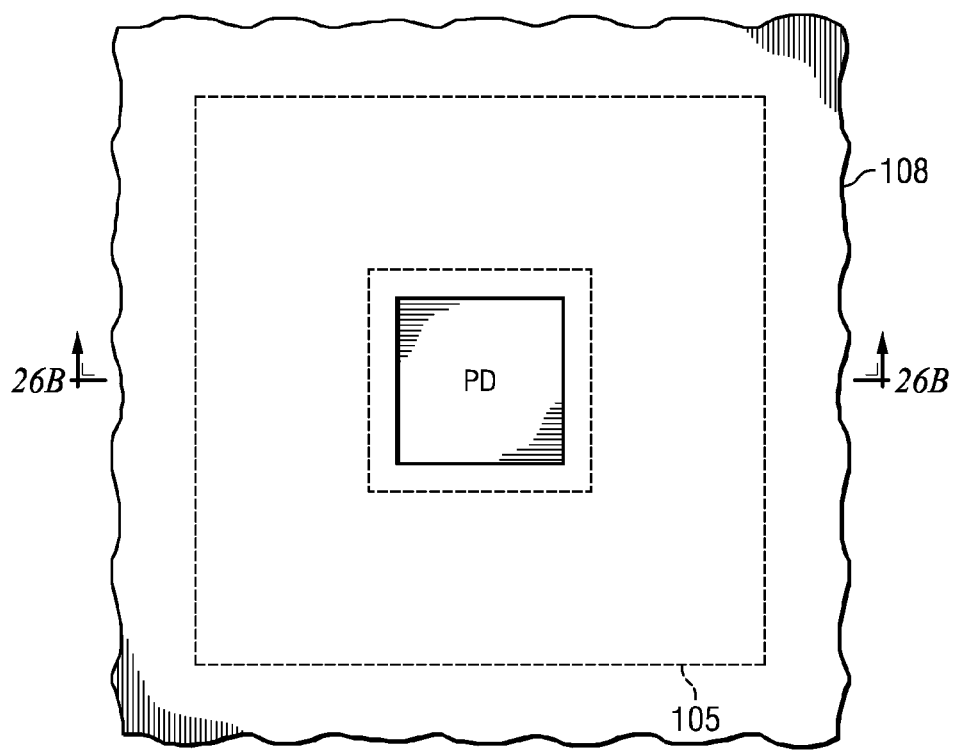
FIG. 26(A) is a plan view of the semiconductor device disclosed in the first conventional example.
Figure 26B:
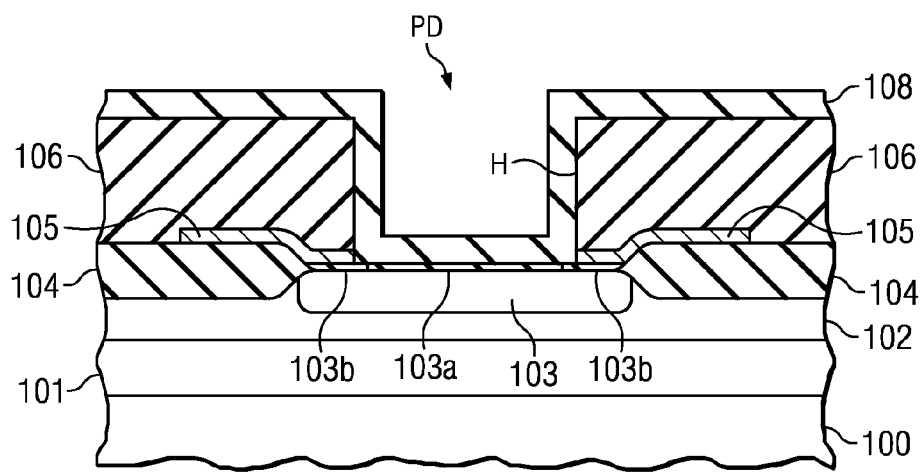
FIG. 26(B) is the cross-sectional view as shown in FIG. 26(A).
Figure 27A:
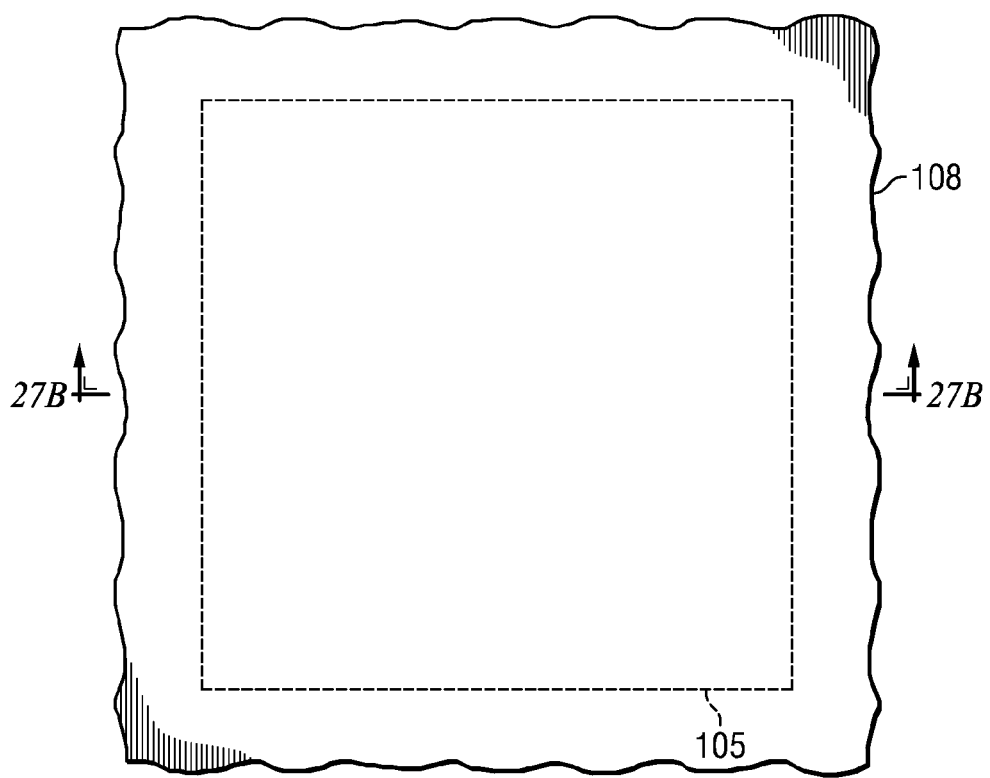
FIG. 27(A) is a plan view illustrating the manufacturing process of the semiconductor device disclosed in the first conventional example.
Figure 27B:
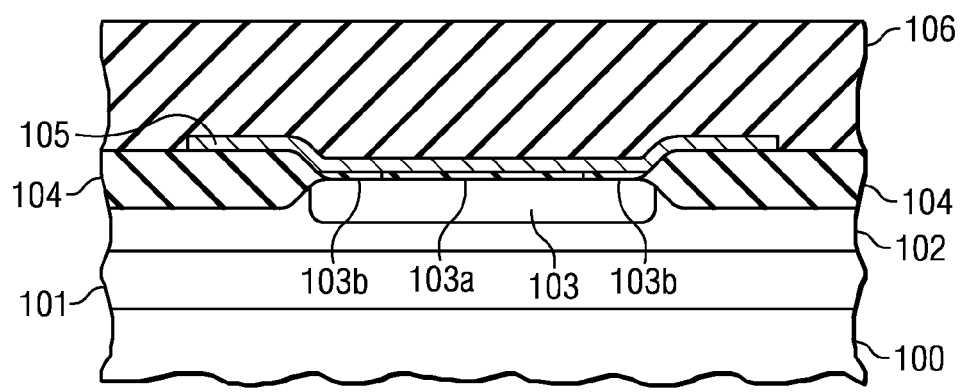
FIG. 27(B) is the cross-sectional view as shown in FIG. 27(A).
Figure 28A:
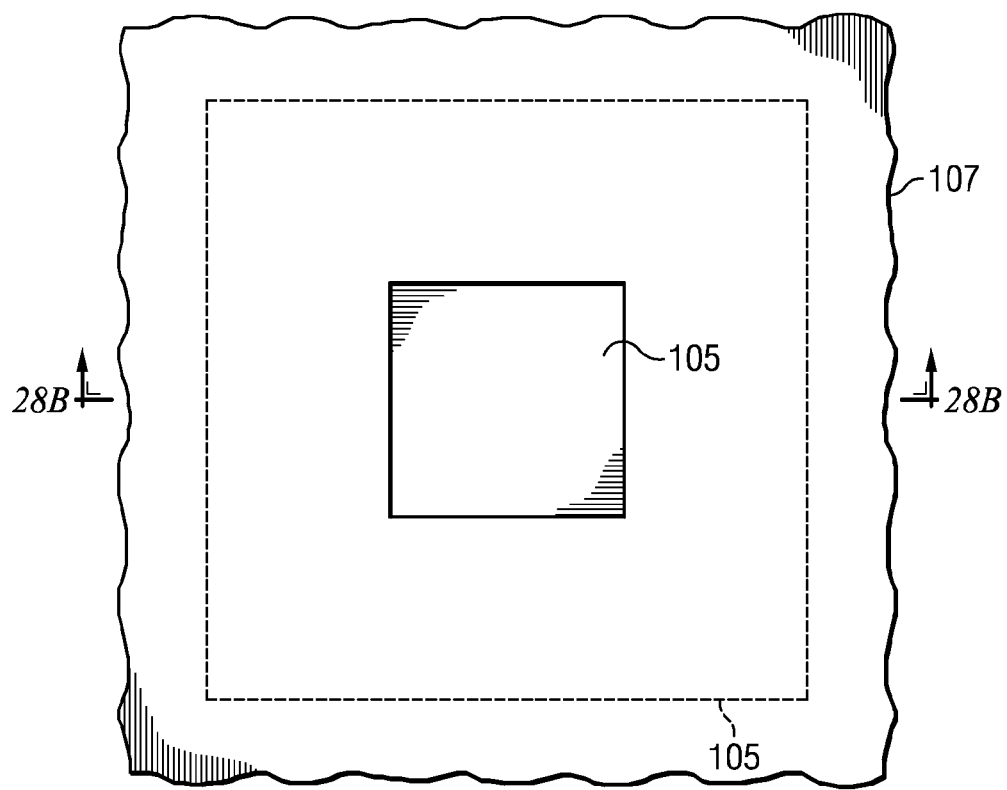
FIG. 28(A) is a plan view illustrating the manufacturing process of the semiconductor device disclosed in the first conventional example.
Figure 28B:
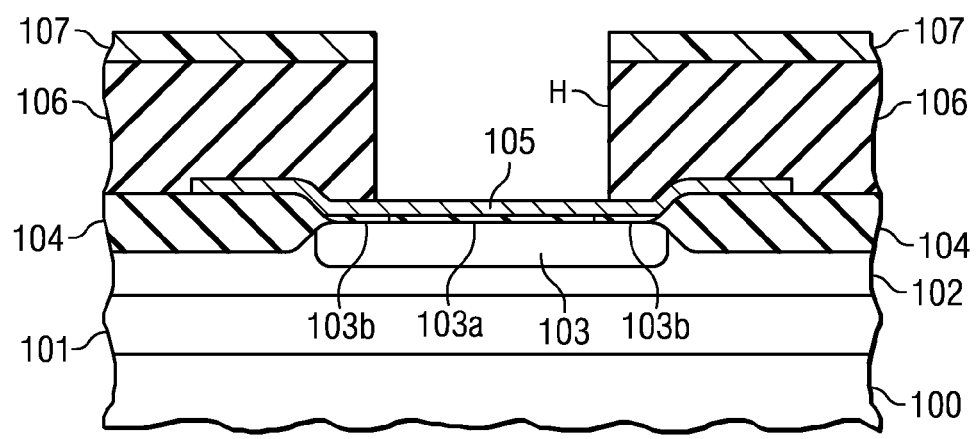
FIG. 28(B) is the cross-sectional view as shown in FIG. 28(A).
Figure 29A:
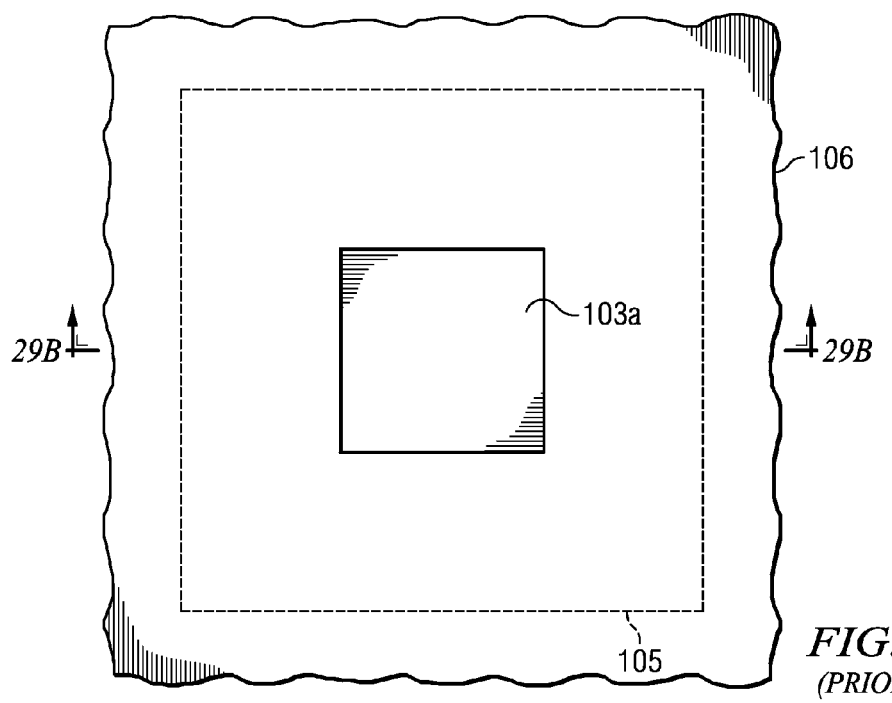
FIG. 29(A) is a plan view illustrating the manufacturing process of the semiconductor device disclosed in the first conventional example.
Figure 29B:
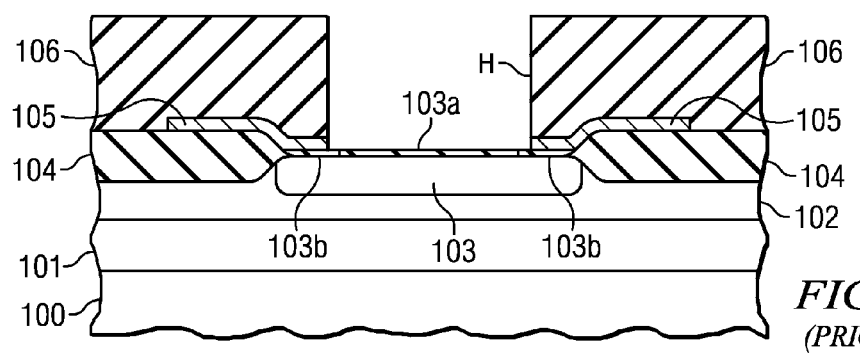
FIG. 29(B) is the cross-sectional view as shown in FIG. 29(A).
Figure 30:
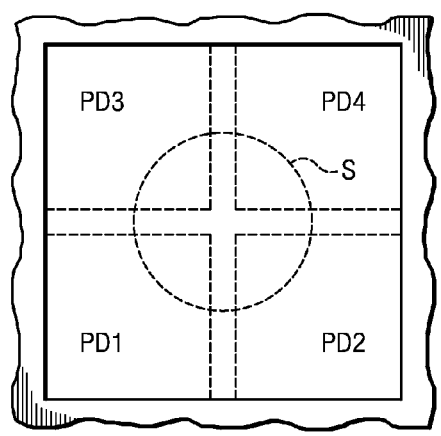
FIG. 30 is a plan view of the semiconductor device disclosed in the second conventional example.
Figure 31:
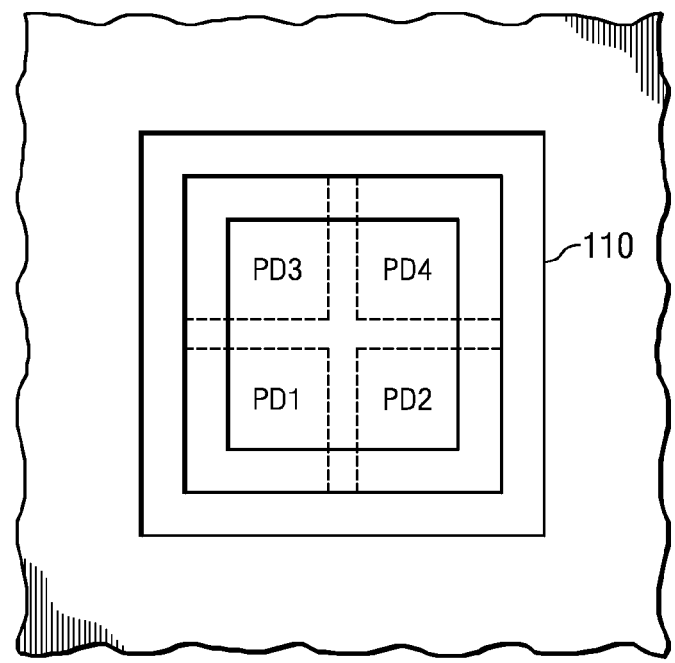
FIG. 31 is a plan view of the semiconductor device disclosed in the third conventional example.
Figure 32:
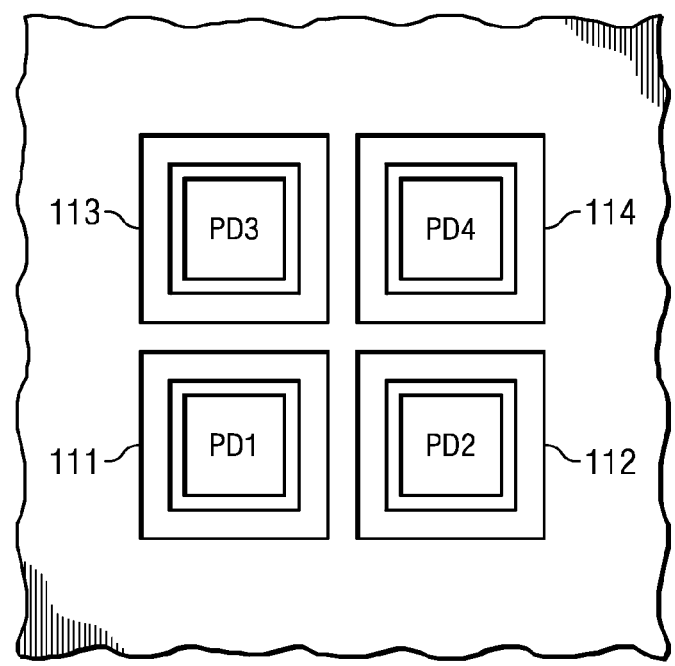
FIG. 32 is a plan view of the semiconductor device disclosed in the fourth conventional example.

Then, as shown in FIG. 25(A) and FIG. 25(B), over-etching is performed during the second etching to also carry out etching in the horizontal direction to remove the first mask layer 28. Because of the presence of silicon nitride layer 16a, there is no need to worry about short circuits even if the first mask layer 28 partially remains, as long as it is on the silicon nitride layer.

After that, an insulation film made of silicon nitride is deposited by CVD to form surface protective layer 26. In this way, the semiconductor device disclosed in this embodiment shown in FIGS. 20(A) and (B) can be manufactured.

For the semiconductor device disclosed in the aforementioned embodiment, even if the opening part is formed in the insulation film in order to improve the sensitivity as described in this manufacturing method, since the conductive layer and the mask layer are used as etching stopper, leakage-causing damage can be prevented. Since the conductive layer connected to the second semiconductor layer that constitutes each photodiode is formed in a pattern divided for each photodiode, the photodiodes can be constituted so as to not short circuit.

In this embodiment, the four PIN photodiodes are separated from each other by the $p^{++}$-type semiconductor region. However, it is also possible to use a LOCOS element-separating insulation film in the same way as described in the second embodiment.

The present invention is not limited to that explained above.

For example, in the aforementioned embodiments, four photodiodes are formed adjacent to each other. It is also possible to form 2, 3, 5, or more photodiodes adjacent to each other.

Also, in each of the aforementioned embodiments, the first semiconductor layer is p-type, and the second semiconductor layer is n-type. It is also possible to reverse these conductivity types.

In each of the aforementioned embodiments, a silicide layer is formed in the n+semiconductor region that forms the second semiconductor layer along the outer periphery with respect to all four photodiodes, and an conductive layer is formed corresponding to that silicide layer. The shape of the silicide layer and the conductive layer, however, is not limited to this. For example, it is possible to form the silicide layer and the conductive layer to surround the $n^+$-type semiconductor region in each of the photodiodes. It is possible to form the silicide layer and the conductive layer in part of the outer peripheral area of the $n^+$-type semiconductor region. It is also possible to form the conductive layer on part of the silicide layer formed on the $n^+$-type conductive layer.

Other variations can be made without deviation from the main point of the present invention.

The semiconductor device of the present invention can be used for light-receiving elements of optical pickup devices incorporated in CD, DVD, or other optical disc devices.

The semiconductor device manufacturing method of the present invention can be used to manufacture semiconductor devices used for light-receiving elements of optical pickup devices incorporated into CD, DVD, or other optical disc devices.

The invention claimed is:

1. A semiconductor device having plural photodiodes formed side-by-side via element-separating regions, comprising:
    a first semiconductor layer of a first conductivity type;
    a second semiconductor layer of a second conductivity type formed on a top surface of the first semiconductor layer;
    element-separating regions formed at least in the second semiconductor layer to separate the plural photodiodes from each other;
    a conductive layer that is connected to the second semiconductor layer in an outer periphery with respect to all of the plural photodiodes and is formed on the second semiconductor layer in a pattern divided for each of the photodiodes; and
    an insulating layer formed over the first and second semiconductor layers, the element-separating regions, and the conductive layer to cover the entire surface of the conductive layer; the insulating layer having an opening that extends to the second semiconductor layer in a central region inside the pattern of the conductive layer, and that exposes a photosensitive region of the semiconductor device;
    wherein the insulating layer comprises a first insulating layer, and a second insulating layer formed on the first insulating layer; and a mask layer is formed between the first and second insulating layers, in a ring shape along an outer periphery of the opening.

2. The semiconductor device of claim 1, wherein the mask layer is formed in a pattern having regions superposed with the conductive layer.

3. The semiconductor device of claim 2, wherein the conductive layer is formed on the element-separating regions between the photodiodes.

* * * * *